United States Patent
Fukuyama et al.

(10) Patent No.: US 8,472,336 B2
(45) Date of Patent: Jun. 25, 2013

(54) NETWORK MANAGEMENT APPARATUS FOR SETTING COMMUNICATION METHOD OF NETWORK APPARATUS

(75) Inventors: Noriyuki Fukuyama, Kawasaki (JP); Hideaki Miyazaki, Kawasaki (JP); Masanobu Morinaga, Kawasaki (JP); Sumiyo Okada, Kawasaki (JP); Satoshi Okuyama, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 370 days.

(21) Appl. No.: 12/860,738

(22) Filed: Aug. 20, 2010

(65) Prior Publication Data

US 2011/0047446 A1 Feb. 24, 2011

(30) Foreign Application Priority Data

Aug. 21, 2009 (JP) ................................. 2009-192430

(51) Int. Cl.
*H04L 1/00* (2006.01)
*H04L 12/50* (2006.01)
*G06F 3/00* (2006.01)

(52) U.S. Cl.
USPC .............................. 370/252; 370/360; 710/16

(58) Field of Classification Search
None
See application file for complete search history.

(56) References Cited

U.S. PATENT DOCUMENTS

| 6,651,184 B1 * | 11/2003 | Hanes et al. ................ 714/5.11 |
| 7,047,326 B1 * | 5/2006 | Crosbie et al. .................. 710/16 |
| 7,460,527 B2 * | 12/2008 | Ghosh et al. .................. 370/360 |
| 2006/0039366 A1 * | 2/2006 | Ghosh et al. .................. 370/360 |
| 2006/0159078 A1 * | 7/2006 | Konda .......................... 370/386 |
| 2007/0283072 A1 * | 12/2007 | Johnson ........................ 710/305 |

FOREIGN PATENT DOCUMENTS

| JP | 2003-87355 A | 3/2003 |
| JP | 2003-258937 A | 9/2003 |
| JP | 2003-258939 A | 9/2003 |
| JP | 2003-298603 A | 10/2003 |
| JP | 2008-148034 A | 6/2008 |

* cited by examiner

*Primary Examiner* — Clemence Han
(74) *Attorney, Agent, or Firm* — Fujitsu Patent Center

(57) ABSTRACT

A network management apparatus includes: a receiving unit for receiving from a first network apparatus a notification of a communication method setting incompatibility with a second network apparatus connected to a first port of the first network apparatus; and a setting unit for setting on the second network apparatus a communication method of the second port of the second network apparatus connected to the first network apparatus such that the communication method of the second port matches a communication method of the first port of the first network apparatus.

13 Claims, 20 Drawing Sheets

FIG. 4

| NETWORK APPARATUS ||  LINK PARTNER IDENTIFIER |
|---|---|---|
| IDENTIFIER | PORT NUMBER | |
| A | 1 | C |
|   | 2 | D |
|   | 3 | E |
|   | 4 | F |
| ⋮ | ⋮ | ⋮ |
| C | 1 | G |
|   | 2 | H |
|   | 3 | I |
|   | 4 | A |
| ⋮ | ⋮ | ⋮ |

FIG. 6

| PORT NUMBER | SETTING | CURRENT SETTING |
|---|---|---|
| 1 | AUTO-NEGOTIATION | FULL-DUPLEX |
| 2 | HALF-DUPLEX | |
| 3 | AUTO-NEGOTIATION | FULL-DUPLEX |
| 4 | AUTO-NEGOTIATION | FULL-DUPLEX |
| ⋮ | ⋮ | ⋮ |

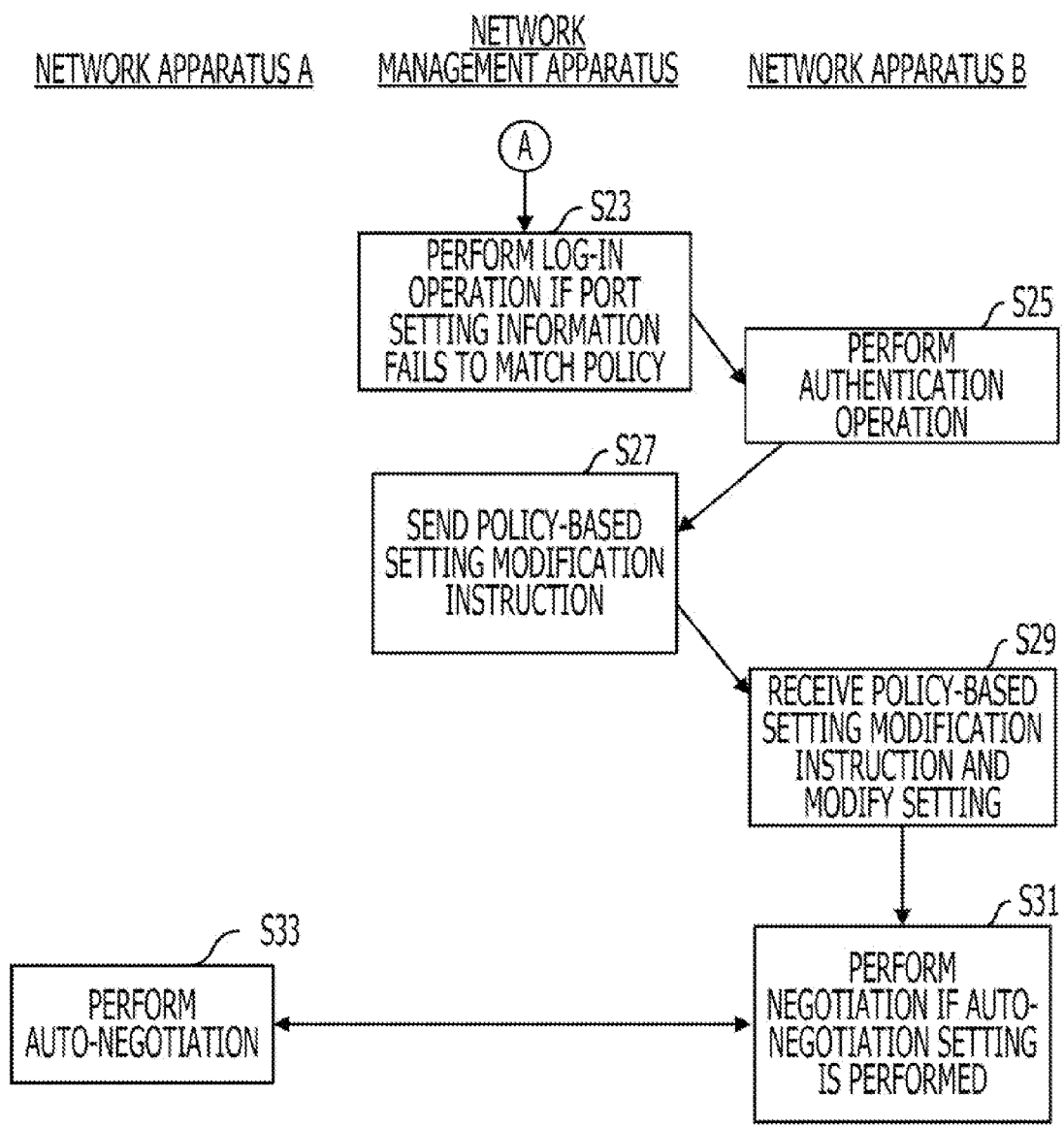

NETWORK MANAGEMENT APPARATUS FOR SETTING COMMUNICATION METHOD OF NETWORK APPARATUS

CROSS-REFERENCE TO RELATED APPLICATIONS

This application is based upon and claims the benefit of priority of the prior Japanese Patent Application No. 2009-192430, filed on Aug. 21, 2009, the entire contents of which are incorporated herein by reference.

FIELD

The embodiments discussed herein are related to a setting of a communication method of a network apparatus.

BACKGROUND

Full-duplex communication and half-duplex communication are available as communication methods used between a network apparatus (such as, e.g., a layer 2 switch or a router) connected to a network (such as, e.g., an Ethernet network) and a terminal apparatus (such as, e.g., a personal computer (PC) or a server). One of the full-duplex communication, the half-duplex communication, and an auto-negotiation is set on a port of each apparatus. Conventionally, if the auto-negotiation is set on a communication source apparatus and the full-duplex communication is set on a communication destination apparatus (also referred to as a link partner), the port set for auto-negotiation is set actually set for half-duplex. Accordingly, a communication method incompatibility takes place in the conventional scenario described above.

SUMMARY

According to an aspect of the invention, a network management apparatus includes: a receiving unit to receive, from a first network apparatus, a notification of a communication method setting incompatibility with a second network apparatus connected to a first port of the first network apparatus; and a setting unit to instruct the second network apparatus to set a communication method of the second port of the second network apparatus connected to the first network apparatus such that the communication method of the second port matches a communication method of the first port of the first network apparatus.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

FIG. 4 illustrates an example of data stored on a link partner storage unit.

FIG. 6 illustrates an example of data stored on a communication method setting storage unit.

FIGS. 7A and 7B are flowcharts of a process of the first embodiment.

DESCRIPTION OF EMBODIMENTS

First Embodiment

Figure 1:
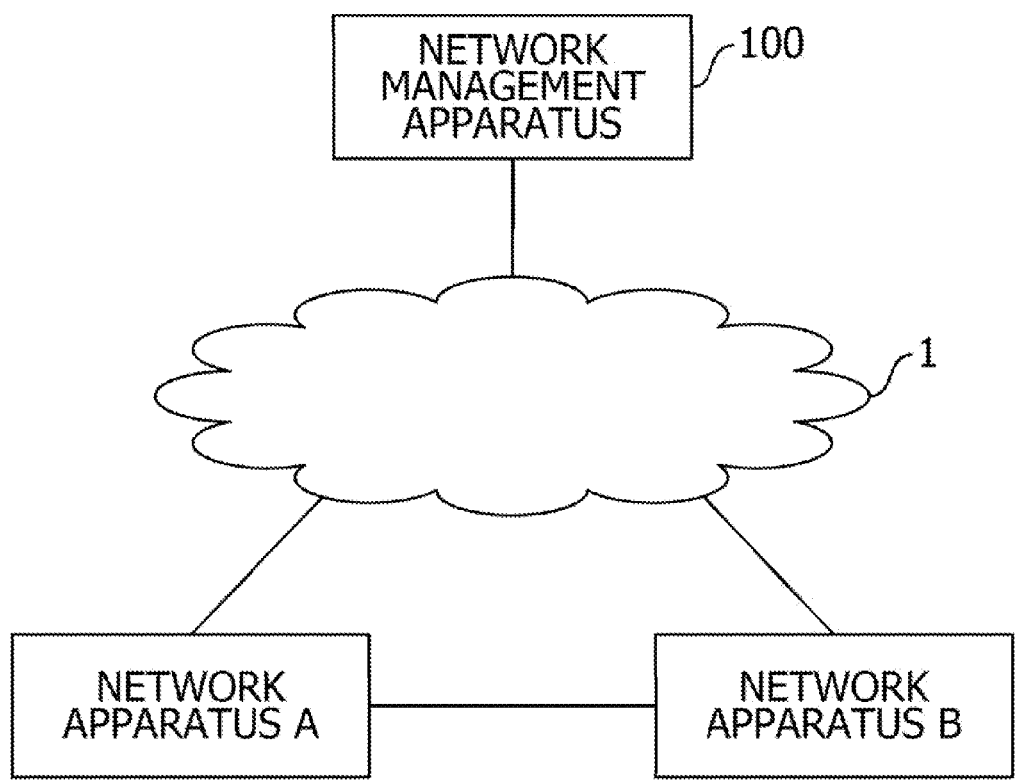
FIG. 1 illustrates a network configuration of a first embodiment.

FIG. 1 illustrates a configuration of a network 1 of a system of a first embodiment. Network apparatuses are linked to the network 1. The network apparatuses include a network management apparatus 100, a network apparatus A and a network apparatus B. The network management apparatus 100 performs a main process in the embodiment. The network apparatuses A and B are a layer 3 switch and a router, for example. The network apparatuses A and B perform communications in accordance with the IEEE 802.3 standard. A particular port of the network apparatus A is connected to a particular port of the network apparatus B. The network apparatus A has a function newly introduced in the embodiment. The network apparatus B has a function of related art.

One network apparatus A and one network apparatus B are illustrated herein, but more network apparatuses may be connected to the network 1.

Figure 2:
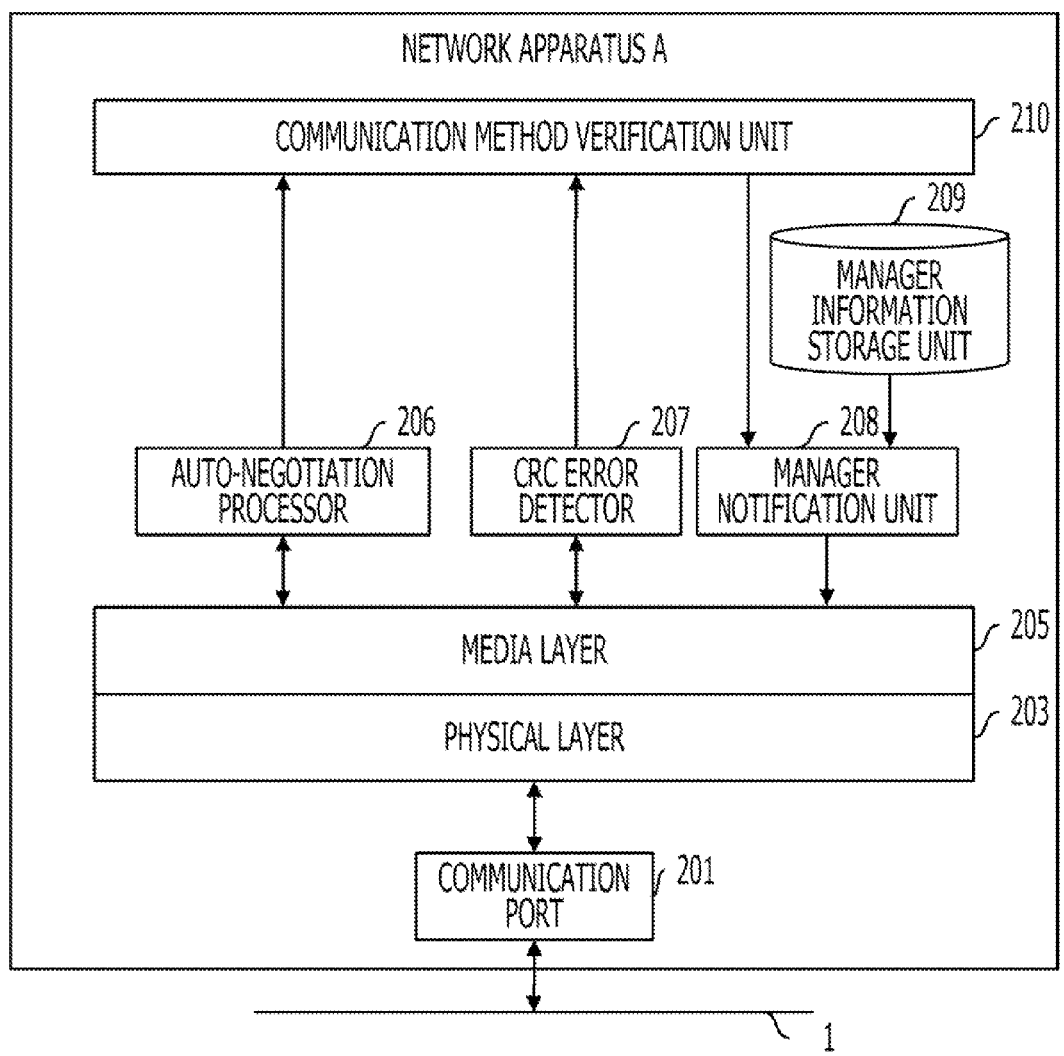
FIG. 2 illustrates a structure of a network apparatus A of the first embodiment.

FIG. 2 illustrates the network apparatus A. Like those of an ordinary network apparatus, the network apparatus A includes a plurality of communication ports 201, a physical layer 203, and a media layer 205. The network apparatus A further includes auto-negotiation processor 206, a cyclic redundant check (CRC) error detector 207, a manager notification unit 208, a manager information storage unit 209, and a communication method verification unit 210.

The auto-negotiation processor 206 automatically sets a communication method with a link partner (e.g., full-duplex or half-duplex communication) in accordance with the IEEE 802.3u standard. The CRC error detector 207 detects a CRC error caused by a late collision. The late collision may take place in response to an anomaly in a cable length or in specification errors of a network apparatus, or a communication method setting incompatibility. For example, a late collision takes place if the communication method of one of the two network apparatuses is fixed full-duplex, and the communication method of the other of the two network apparatuses is fixed half-duplex.

The communication method verification unit 210 acquires from the auto-negotiation processor 206 auto-negotiation results, and acquires a detected CRC error from the CRC error detector 207. The communication method verification unit 210 determines whether to notify the network management apparatus 100 of the acquired auto-negotiation results and the CRC error detection. If it is determined that the network management apparatus 100 is to be notified of the acquired auto-negotiation results and the CRC error detection, the communication method verification unit 210 causes the manager notification unit 208 to notify the network management apparatus 100 of the acquired auto-negotiation results and the CRC error detection. The manager information storage unit 209 stores an IP address and a MAC address of the network management apparatus 100. In response to an instruction from the communication method verification unit 210, the manager notification unit 208 sends to the network management apparatus 100 identification information of the network apparatus A (identifiers such as, e.g., the IP address and the MAC address) and a setting incompatibility notification including an identifier of a communication port to which the network apparatus B is connected.

In accordance with the embodiment, the network administrator has appropriately set a communication method on each communication port of the network apparatus A. More specifically, auto-negotiation or fixed full-duplex is set on each port of the network apparatus A.

Figure 3:
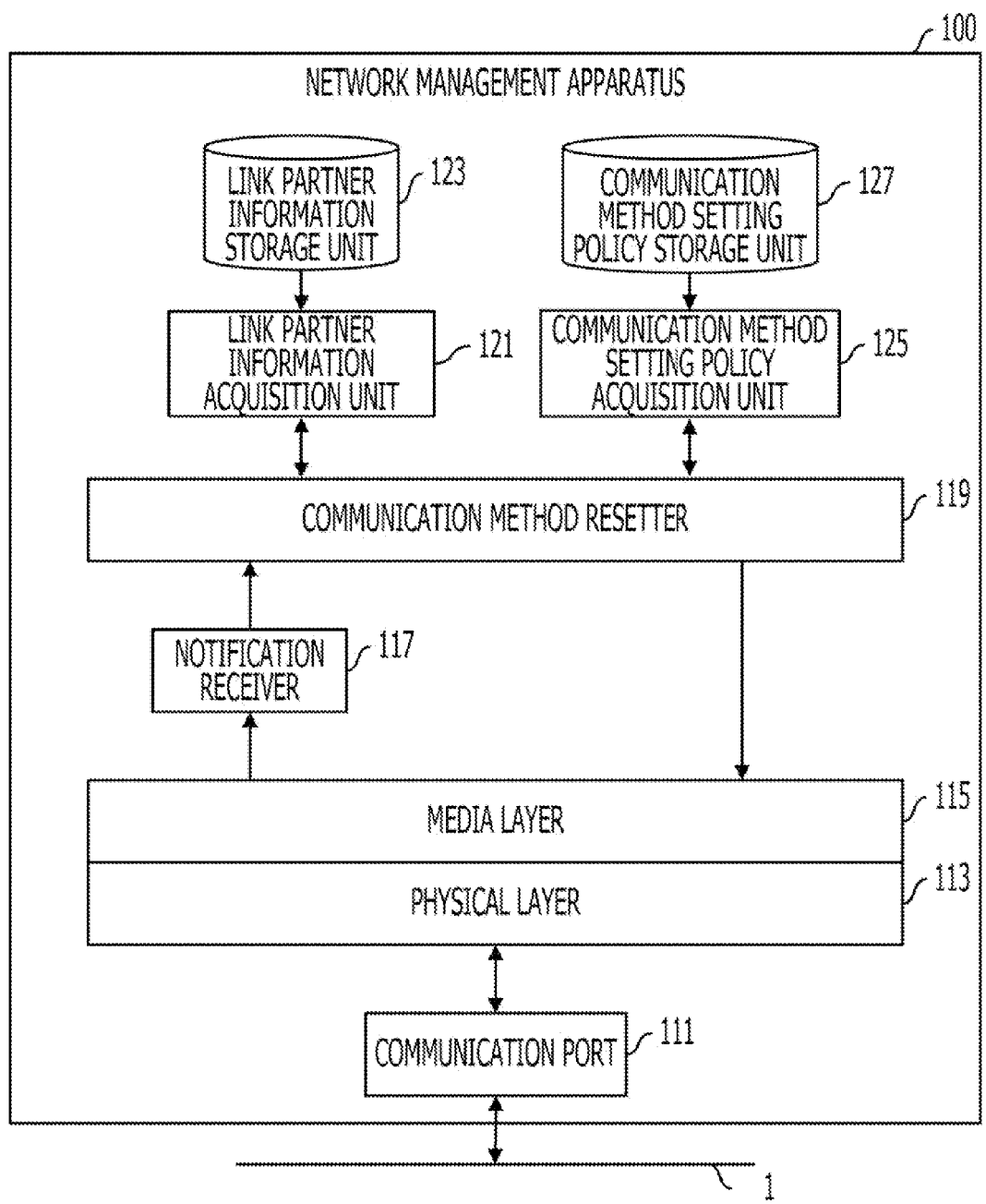
FIG. 3 illustrates a structure of a network management apparatus of the first embodiment.

FIG. 3 illustrates a structure of the network management apparatus 100. In addition to at least one communication port 111, a physical layer 113, and a media layer 115, typically provided on an ordinary network apparatus, the network management apparatus 100 includes a notification receiver 117, a communication method resetter 119, a link partner information acquisition unit 121, a link partner information storage unit 123, a communication method setting policy acquisition unit 125, and a communication method setting policy storage unit 127.

The notification receiver 117 receives the setting incompatibility notification from the network apparatus A via the communication port 111, the physical layer 113, and the media layer 115 and then outputs to the communication method resetter 119 the received setting incompatibility notification. The link partner information storage unit 123 is a database storing a topology of an adjacent node in the network 1, for example, storing data illustrated in FIG. 4. As illustrated in FIG. 4, identifiers of a link partner (such as, e.g., an IP address or a MAC address) are stored on the database for each combination of an identifier of a network apparatus (such as, e.g., an IP address or a MAC address) and port identification information (such as, e.g., a port number). The database thus identifies a network apparatus connected to a specified port of a transmission source network apparatus from which the setting incompatibility notification has been received. For example, a network apparatus C may be connected to a port number 1 of the network apparatus A and the network apparatus A may be connected to a port number 4 of the network apparatus C.

In response to an instruction from the communication method resetter 119, the link partner information acquisition unit 121 retrieves from the link partner information storage unit 123 information regarding the network apparatus B and then outputs the retrieved information to the communication method resetter 119.

The communication method setting policy storage unit 127 stores a communication method setting policy (hereinafter simply referred to as a policy) determining that the communication method to be set is auto-negotiation or fixed full-duplex. A policy stored on the communication method setting policy storage unit 127 is already set on the network apparatus A.

In response to an instruction from the communication method resetter 119, the communication method setting policy acquisition unit 125 retrieves a policy from the communication method setting policy storage unit 127 and then outputs the retrieved policy to the communication method resetter 119.

Upon receiving the setting incompatibility notification from the network apparatus A via the notification receiver 117, the communication method resetter 119 receives the link partner information (i.e., information regarding the network apparatus B) from the link partner information acquisition unit 121 and the communication method setting policy from the communication method setting policy acquisition unit 125. In accordance with the link partner information, the communication method resetter 119 acquires from the network apparatus B data indicating a set status of the port of the network apparatus B and judges whether to modify the setting in accordance with the policy. If the communication method resetter 119 judges that the setting is to be modified, the communication method resetter 119 causes the network apparatus B to modify the setting in accordance with the policy.

Figure 5:
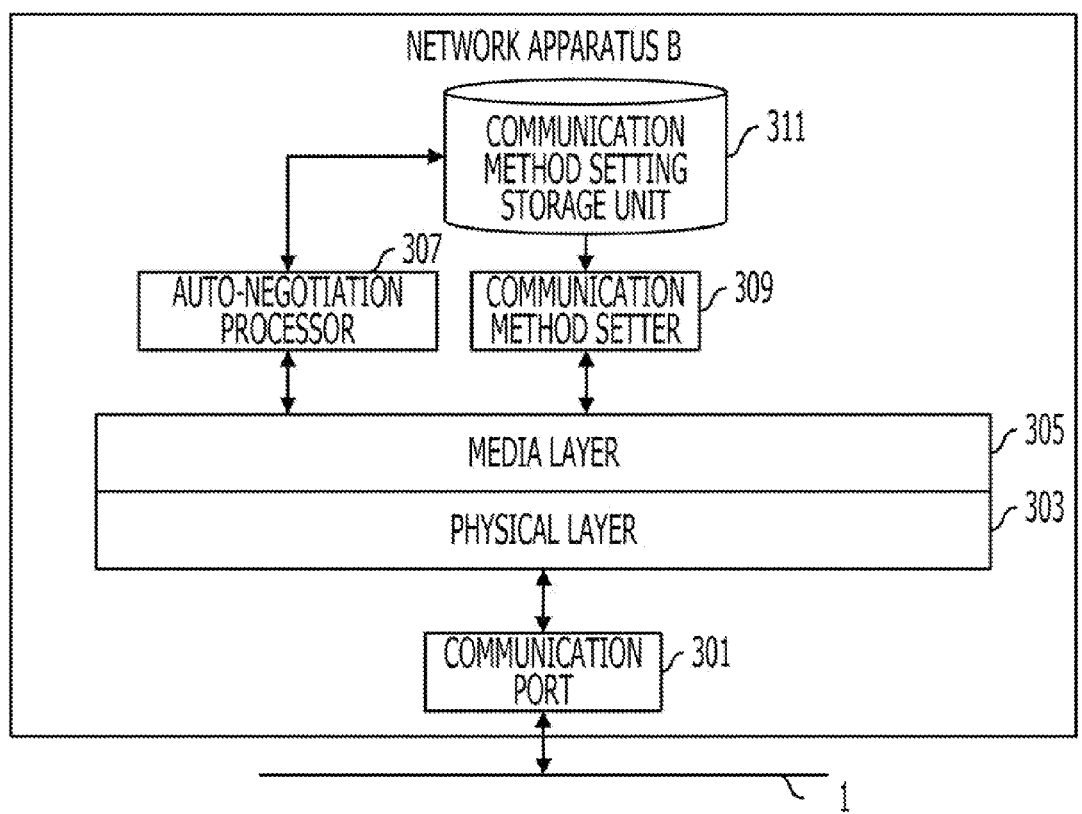
FIG. 5 illustrates a structure of a network apparatus B of the first embodiment.

FIG. 5 illustrates a structure of the network apparatus B of related art. In addition to a plurality of communication ports 301, a physical layer 303, and a media layer 305, typically provided on an ordinary network apparatus, the network apparatus B includes an auto-negotiation processor 307, a communication method setter 309, and a communication method setting storage unit 311.

In accordance with the IEEE 802.3u standard, on the communication port 301 set for auto-negotiation, the auto-negotiation processor 307 automatically sets a communication method (e.g., full-duplex or half-duplex) with a link partner in auto-negotiation. The auto-negotiation results are stored on the communication method setting storage unit 311.

The communication method setter 309 reads from the communication method setting storage unit 311a communication method which the network apparatus B is instructed to read in accordance with command line interface (CLI) from outside, and then sends the read communication method to a requesting source. The communication method setter 309 also sets on the communication method setting storage unit 311a communication method which the network apparatus B is instructed to set in accordance with CLI.

FIG. 6 illustrates an example of data stored on the communication method setting storage unit 311. Referring to FIG. 6, the setting (auto-negotiation, fixed half-duplex, or fixed full-duplex) and the communication method actually set in auto-negotiation (current setting) are registered for each communication port on the communication method setting storage unit 311. The communication method setting storage unit 311 and the communication method setter 309 are also included in the network apparatus A (though not illustrated in FIG. 2).

Figure 7A:
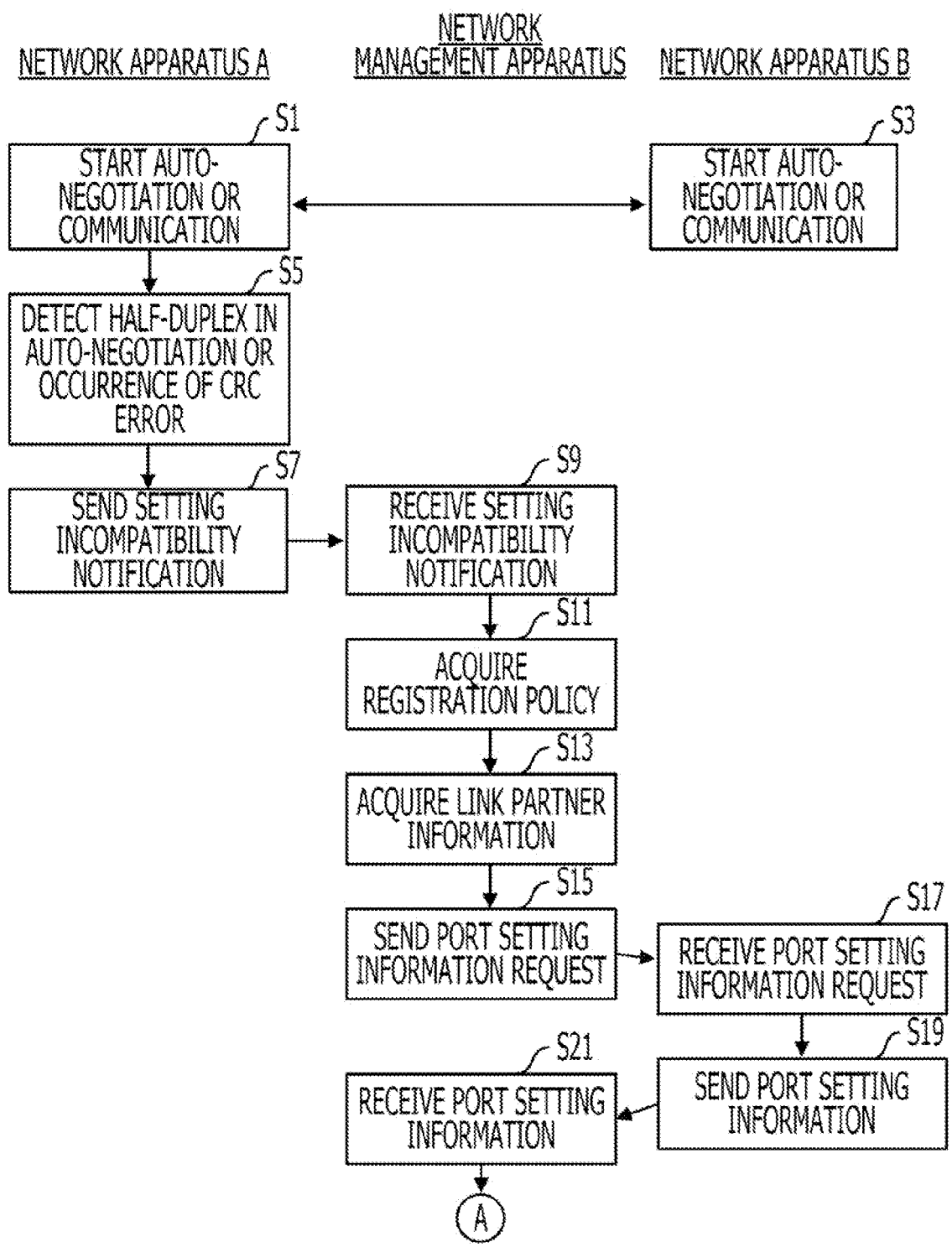

Processes performed by each of the network apparatuses A and B and the network management apparatus 100 are described with reference to FIGS. 7A and 7B. In this case, the network apparatuses A and B are linked up with a port having a port number 1 of the network apparatus A connected to a port having a port number 2 of the network apparatus B via a cable.

If the ports of the network apparatuses A and B are set for auto-negotiation, the auto-negotiation processor 206 and the auto-negotiation processor 307 perform respectively auto-negotiation. If fixed full-duplex or fixed half-duplex is port-set on the network apparatuses A and B, communications start (steps S1 and S3). If auto-negotiation is set on the network apparatuses A and B, fixed full-duplex is typically set as previously discussed. Auto-negotiation may be set as a communication method for the port having port number 1 on the network apparatus A and fixed full-duplex or fixed half-duplex may be set as a communication method for the port having port number 2 on the network apparatus B. In such a case, fixed half-duplex is set on the port having port number 1 on the network apparatus A. If the fixed full-duplex or fixed half-duplex is set on the network apparatuses A and B, the fixed full-duplex communication or the fixed half-duplex communication is performed without any problem. The fixed half-duplex communication provides low communication efficiency. The fixed half-duplex is also set on the network apparatus A because the network administrator sets a policy for the fixed half-duplex, and such a setting provides no particular problem. If the network apparatuses A and B are not set for auto-negotiation and are still different in setting, communications start, and a late collision occurs. For example, a late collision occurs if the network apparatus A is set for fixed full-duplex and the network apparatus B is set for auto-negotiation.

In accordance with the embodiment, the auto-negotiation processor 206 may set fixed half-duplex in response to auto-negotiation results and notify the communication method verification unit 210 of the auto-negotiation results or the CRC error detector 207 may detect a CRC error caused by a late collision and notify the communication method verification unit 210 of the detection of the CRC error. In response, the communication method verification unit 210 detects the half-duplex setting in the auto-negotiation or the CRC error (step S5).

The communication method verification unit 210 then instructs the manager notification unit 208 to send the setting incompatibility notification. The manager notification unit 208 reads an IP address or a MAC address of the network management apparatus 100 stored on the manager information storage unit 209, and sends to the IP address or the MAC address the setting incompatibility notification including identification information of the network apparatus A (such as, e.g., an IP address, a MAC address, or a network name) and port identification information of a linked up communication port 201 (such as, e.g., a port number) (step S7).

The notification receiver 117 in the network management apparatus 100 receives the setting incompatibility notification including the identification information of the network apparatus A and the port identification information of linked up communication port 201, and outputs the received setting incompatibility notification to the communication method resetter 119 (step S9). The communication method resetter 119 requests the policy from the communication method setting policy acquisition unit 125. In response to the request, the communication method setting policy acquisition unit 125 reads the set policy from the communication method setting policy storage unit 127, and outputs the read policy to the communication method resetter 119. The communication method resetter 119 receives the policy from the communication method setting policy acquisition unit 125 (step S11). The setting incompatibility notification may include setting information of the port 1 of the network apparatus A. If the setting incompatibility notification includes the setting information of the port 1 of the network apparatus A, the step S11 may be eliminated, and the communication method setting policy acquisition unit 125 and the communication method setting policy storage unit 127 may not be needed.

The communication method resetter 119 in the network management apparatus 100 requests from the link partner information acquisition unit 121 the setting incompatibility notification including the identification information of the network apparatus A and link partner information corresponding to a port identifier of linked up communication port 201 (also referred to as adjacent node information). In response to the request, the link partner information acquisition unit 121 reads from the link partner information storage unit 123 the link partner information and outputs the link partner information to the communication method resetter 119. The link partner information includes the identification information of the link partner (the identification information of the network apparatus B (an IP address, a MAC address, and other identification information such as, e.g., a network name) and identification information of a port connected to the port 1 of the network apparatus A and linked up (port number 2 here)). The communication method resetter 119 receives the link partner information from the link partner information acquisition unit 121 (step S13).

Using the identification information of the network apparatus B included in the link partner information acquired in step S13, the communication method resetter 119 requests the network apparatus B to send setting information of a port identified by the port identification information (the above-described port number 2) also included in the link partner information (step S15). This request may be performed using CLI or a simple network management protocol (NMP). The communication method setter 309 in the network apparatus B receives the port setting information request from the network management apparatus 100 (step S17). The communication method setter 309 reads the port setting information (also including current setting information in the case of auto-negotiation) from the communication method setting storage unit 311, and then sends the port setting information to the network management apparatus 100 (step S19). In the discussion of an example of an embodiment of the present invention, an authentication operation is performed in a modification of the setting but is not performed in the reading of the setting information. Alternatively, an authentication operation may also be performed in the reading of the setting information. Upon receiving the port setting information from the network apparatus B, the communication method resetter 119 in the network management apparatus 100 stores the port setting information on a storage device such as a main memory or a work memory (step S21). Processing proceeds to a routine of FIG. 7B via an entry point A.

In the routine of FIG. 7B, the communication method resetter 119 in the network management apparatus 100 judges whether the policy acquired in step S11 matches the port setting information acquired in step S21. If the policy matches the port setting information, no setting modification is needed. However, this suggests another problem (such as, e.g., a cable anomaly). If the policy matches the port setting information, an alert mail may be transmitted to the network administrator.

If it is judged that the policy acquired in step S11 does not match the port setting information acquired in step S21, the communication method resetter 119 performs a log-in operation on the network apparatus B (step S23). The communication method setter 309 in the network apparatus B performs an authentication operation on the network management apparatus 100 (step S25). If the authentication operation is not successful, no further operation is naturally performed. It is assumed here that the authentication operation has been successfully completed. The log-in operation and the authentication operation are known operations and no further discussion thereabout are provided here.

In response to the policy, the communication method resetter 119 instructs the network apparatus B to modify the setting of the port having port number 2 on the network apparatus B (step S27). The communication method setter 309 in the network apparatus B receives a policy-based setting modification instruction from the network management apparatus 100. In response to the policy-based setting modification instruction, the communication method setter 309 sets the communication method of the port having port number 2 to auto-negotiation or fixed full-duplex (step S29). More specifically, a new setting of the port is registered on the communication method setting storage unit 311. The setting modification instruction and the setting modification responsive to the setting modification instruction are performed through CLI and are known in related art. No further discussion thereabout is provided here.

If the policy is fixed full-duplex and fixed full-duplex is set on the network apparatus B as a link partner, a calibration may be performed on the port having port number 2 on the network apparatus B. Communications then start. If auto-negotiation is set on the network apparatus B, the apparatuses are treated as being linked up at the moment of the modification of the setting. An auto-negotiation operation is performed between the auto-negotiation processor 206 in the network apparatus A and the auto-negotiation processor 307 in the network apparatus B. Full-duplex is thus set (steps S31 and S33).

The network apparatus A modifies the setting of the network apparatus B as a link partner of the network apparatus A in accordance with the policy. The network apparatus A thus performs efficient communication with the network apparatus B.

Second Embodiment

Figure 8:
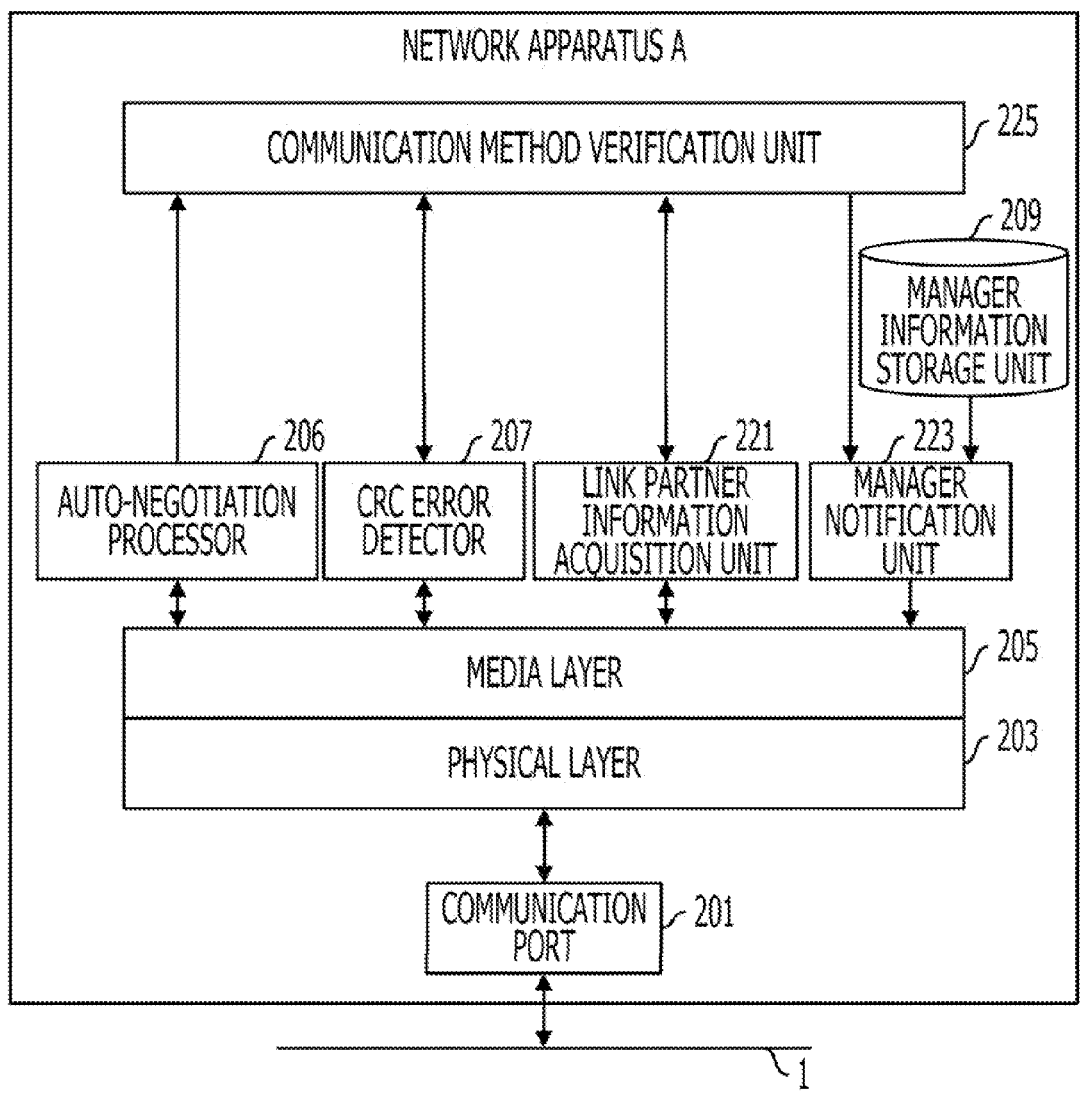
FIG. 8 illustrates a structure of a network apparatus A of a second embodiment.

A second embodiment is described below. The second embodiment has a network configuration similar to the network configuration of the first embodiment. The network apparatus A has a structured illustrated in FIG. 8. Elements identical to those of the network apparatus A of the first embodiment are designated with the same reference numerals.

Like an ordinary network apparatus, the network apparatus A includes the plurality of communication ports 201, the physical layer 203, and the media layer 205. The network apparatus A further includes an auto-negotiation processor 206, a CRC error detector 207, a link partner information acquisition unit 221, a manager notification unit 223, a manager information storage unit 209, and a communication method verification unit 225.

In response to an instruction from the communication method verification unit 225, the link partner information acquisition unit 221 requests from the network apparatus B the identification information (e.g., an IP address, a MAC address, and other identifiers including a network name) of the network apparatus B as a link partner connected to linked up communication port 201 and port identification information such as, e.g., a port number, through link layer discovery protocol (LLDP) or an any proprietary protocol. The link partner information acquisition unit 221 then acquires these pieces of information.

The communication method verification unit 225 acquires auto-negotiation results from the auto-negotiation processor 206 and a detection of a CRC error from the CRC error detector 207. The communication method verification unit 225 judges whether to notify the network management apparatus 100 of the acquired negotiation results and the detection of the CRC error. If it is judged that the network management apparatus 100 is to be notified of the acquired negotiation results and the detection of the CRC error, the communication method verification unit 225 acquires from the link partner information acquisition unit 221 information regarding the network apparatus B as a link partner, and causes the manager notification unit 223 to notify the network management apparatus 100 of the acquired negotiation results and the detection of the CRC error.

The manager information storage unit 209 stores the IP address or the MAC address of the network management apparatus 100. In response to an instruction from the communication method verification unit 225, the manager notification unit 223 sends the setting incompatibility notification to the network management apparatus 100. The setting incompatibility notification includes the identification information of the network apparatus A (the IP address, the MAC address, and other identifiers including the network name), the identifier of the communication port connected to the network apparatus B, the identification information of the network apparatus B as a link partner, and the identification information of the port connected to the network apparatus A.

In the embodiment, each communication port of the network apparatus A is appropriately set for a communication method by the network administrator. More specifically, auto-negotiation or fixed full-duplex is set on each port on the network apparatus A.

Figure 9:
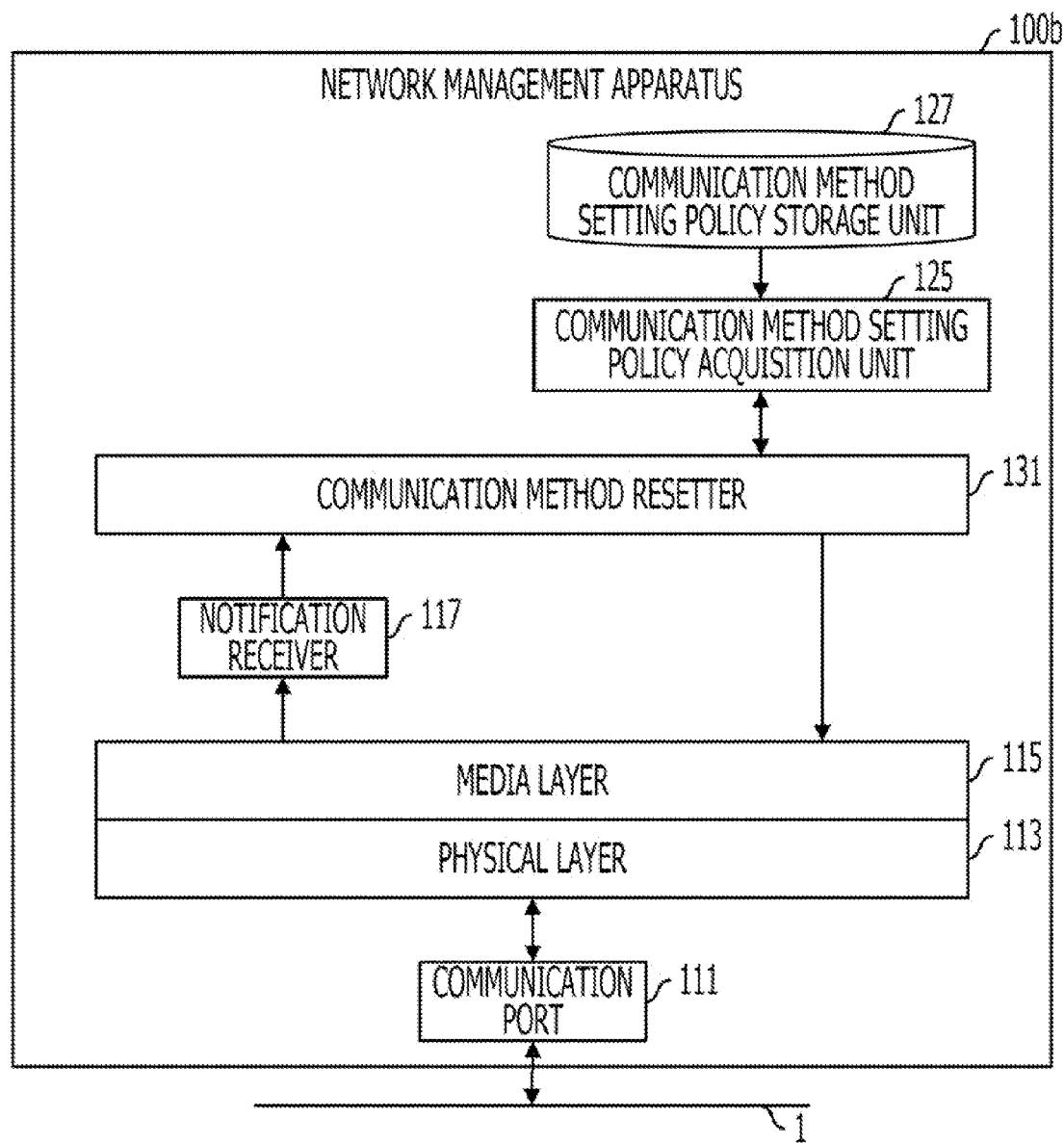
FIG. 9 illustrates a structure of a network management apparatus of the second embodiment.

FIG. 9 illustrates a structure of a network management apparatus 100b of the embodiment. In FIG. 9, elements identical to those in the network management apparatus 100 of the first embodiment are designated with the same reference numeral.

The network management apparatus 100b includes at least one communication port 111, a physical layer 113 and a media layer 115. The network management apparatus 100b further includes a notification receiver 117, a communication method resetter 131, a communication method setting policy acquisition unit 125, and a communication method setting policy storage unit 127. The link partner information acquisition unit 121 and the link partner information storage unit 123, which are included in the first embodiment, become unnecessary in the second embodiment.

The notification receiver 117 receives the setting incompatibility notification from the network apparatus A via the communication port 111, the physical layer 113, and the media layer 115, and outputs the received setting incompatibility notification to the communication method resetter 131.

A communication method to be used is registered on the communication method setting policy storage unit 127 by the network administrator. In accordance with the embodiment, auto-negotiation or fixed full-duplex are registered as a policy. It is noted that the policy registered on the communication method setting policy storage unit 127 has been set on the network apparatus A.

In response to an instruction from the communication method resetter 131, the communication method setting policy acquisition unit 125 reads policy data from the communication method setting policy storage unit 127 and outputs the read policy data to the communication method resetter 131.

In response to the setting incompatibility notification received from the network apparatus A via the notification receiver 117, the communication method resetter 131 extracts information of the link partner (i.e., information regarding the network apparatus B) from the setting incompatibility notification and acquires a communication method setting policy from the communication method setting policy acquisition unit 125. In accordance with the link partner information, the communication method resetter 131 acquires from the network apparatus B data indicating a setting state of the port of the network apparatus B. The communication method resetter 131 judges whether to modify the setting in accordance with the policy. If it is determined that the setting is to be modified, the communication method resetter 131 causes the network apparatus B to modify the setting in accordance with the policy.

Figure 10:
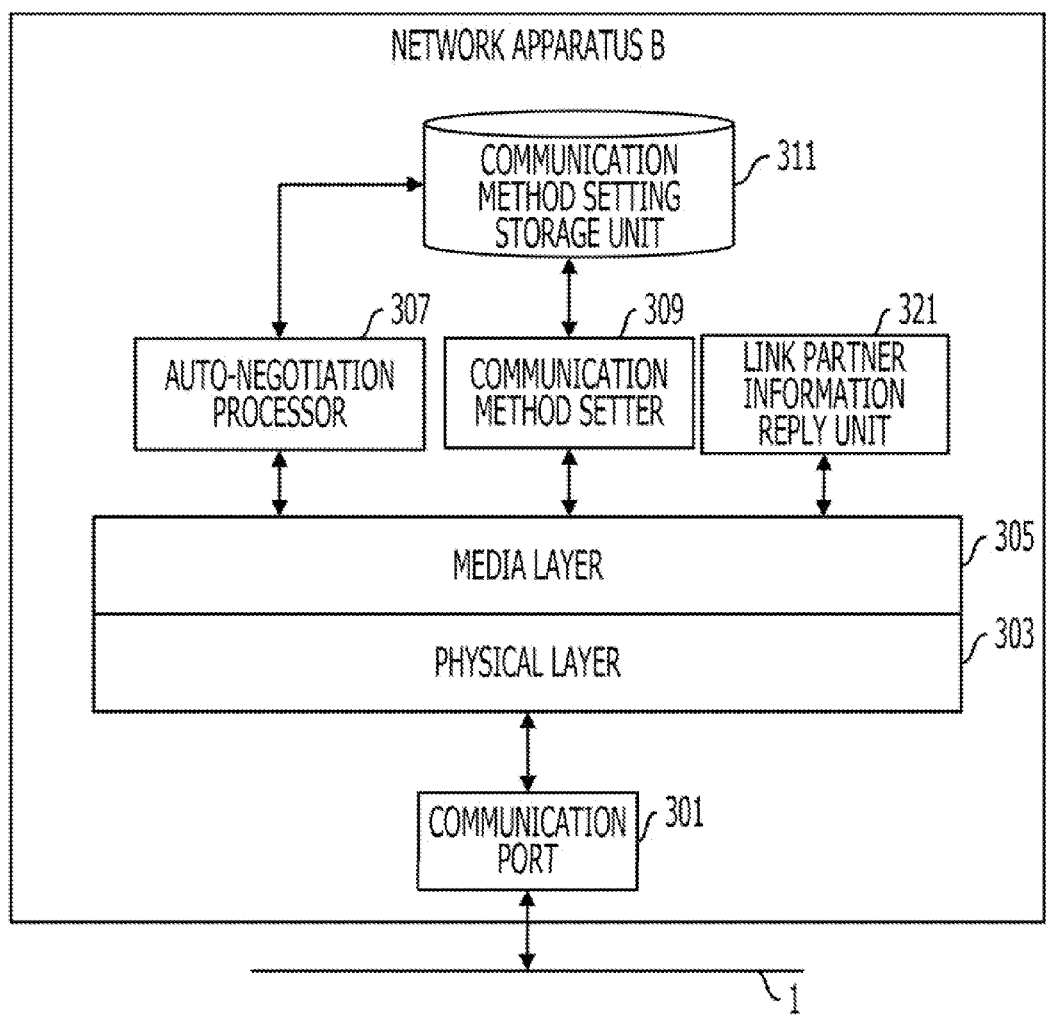
FIG. 10 illustrates a structure of a network apparatus B of the second embodiment.

FIG. 10 illustrates a structure of the network apparatus B. In addition to at least one communication port 301, a physical layer 303, and a media layer 305, typically included in a known network apparatus, the network apparatus B includes an auto-negotiation processor 307, a communication method setter 309, a communication method setting storage unit 311, and a link partner information reply unit 321.

The auto-negotiation processor 307, the communication method setter 309, and the communication method setting storage unit 311 remain unchanged from the counterparts in the first embodiment, and a further discussion thereof is omitted here.

The link partner information acquisition unit 221 in the network management apparatus 100b may request the link partner information reply unit 321 to send the link partner information in accordance with LLDP or the like. In response to the request, the link partner information reply unit 321 sends data responsive to the request (e.g., the identification information of the network apparatus B, and the identification information such as the port number of the communication port connected to the network apparatus A).

Figure 11:
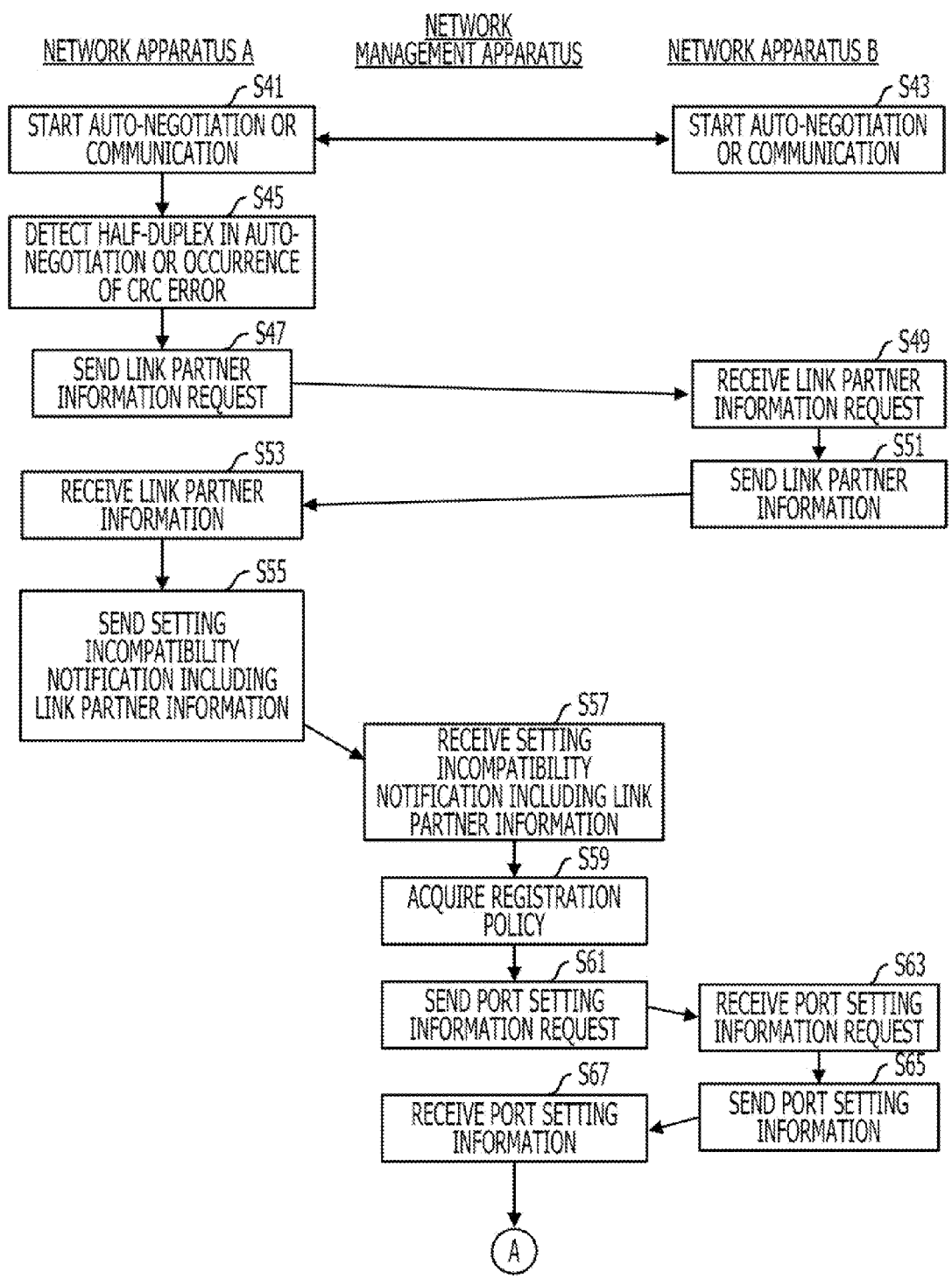
FIG. 11 is a flowchart illustrating a process of the second embodiment.

Processes of the network apparatuses A and B and the network management apparatus 100b is described below with reference to FIG. 11. The network apparatuses A and B are linked up with the port having port number 1 on the network apparatus A connected to the port having port number 2 on the network apparatus B.

If the ports of the network apparatuses A and B are set for auto-negotiation, the auto-negotiation processor 206 and the auto-negotiation processor 307 perform respectively auto-negotiation. If fixed full-duplex or fixed half-duplex is port-set on the network apparatuses A and B, communications start (steps S41 and S43). If auto-negotiation is set on the network apparatuses A and B, fixed full-duplex is typically set. Auto-negotiation may be set as a communication method for the port having port number 1 on the network apparatus A and fixed full-duplex or fixed half-duplex may be set as a communication method for the port having port number 2 on the network apparatus B. In such a case, fixed half-duplex is set on the port having port number 1 on the network apparatus A. If the fixed full-duplex or fixed half-duplex is set on the network apparatuses A and B, the fixed full-duplex communication or the fixed half-duplex communication is performed without any problem. The fixed half-duplex communication provides low communication efficiency. The fixed half-duplex is set on the network apparatus A because the network administrator sets a policy for the fixed half-duplex, and such a setting provides no particular problem. If the network apparatuses A and B are not set for auto-negotiation and are still different in setting, communications start, and a late collision occurs. For example, a late collision occurs if the network apparatus A is set for fixed full-duplex and the network apparatus B is set for auto-negotiation negotiation.

In accordance with the embodiment, the auto-negotiation processor 206 may set half-duplex in response to auto-negotiation results and notify the communication method verification unit 225 of the auto-negotiation results or the CRC error detector 207 may detect a CRC error caused by a late collision and notify the communication method verification unit 225 of the detection of the CRC error. In such a case, the communication method verification unit 225 detects the half-duplex setting in the auto-negotiation or the CRC error (step S45).

The communication method verification unit 225 requests the link partner information acquisition unit 221 to acquire adjacent node information regarding the communication port 201 through which the half-duplex setting or the occurrence of a CRC error is detected. The link partner information acquisition unit 221 requests the network apparatus B to send the link partner information regarding the communication port 201 through which the half-duplex setting or the occurrence of the CRC error is detected (step S47). The link partner information includes the identification information of the network apparatus B and the identification information of the port number of the port connected to the network apparatus A. As previously discussed, this request is performed through LLDP or the like. Upon receiving the link partner information request (step S49), the link partner information reply unit 321 in the network apparatus B sends the link partner information to the network apparatus A as a requesting source (step S51). The link partner information includes the identification information of the network apparatus B (such as, e.g., the IP address, the MAC address, or the other identifier such as the network name) and the port identification information of the port number of the linked up port (step S51).

The link partner information acquisition unit 221 in the network apparatus A receives from the network apparatus B the link partner information and outputs the received link partner information to the communication method verification unit 225 (step S53).

The communication method verification unit 225 outputs the link partner information to the manager notification unit 223 and instructs the manager notification unit 223 to send the setting incompatibility notification. The manager notification unit 223 reads an IP address or a MAC address of the network management apparatus 100 stored on the manager information storage unit 209, and sends to the IP address or the MAC address the setting incompatibility notification including the link partner information (step S55). The setting incompatibility notification may further include the identification information of the network apparatus A (for examples, the IP address, the MAC address, or the other identifier such as the network name) and the port identification information of the linked up communication port 201 (such as, e.g., the port number).

The notification receiver 117 in the network management apparatus 100b receives the setting incompatibility notification including the link partner information, and outputs the received setting incompatibility notification to the communication method resetter 131 (step S57). The communication method resetter 131 requests the policy from the communication method setting policy acquisition unit 125. In response to the request, the communication method setting policy acquisition unit 125 reads the set policy from the communication method setting policy storage unit 127, and outputs the read policy to the communication method resetter 131. The communication method resetter 131 receives the policy from the communication method setting policy acquisition unit 125 (step S59). The setting incompatibility notification may include setting information of the port 1 of the network apparatus A. If the setting incompatibility notification includes the setting information of the port 1 of the network apparatus A, the step S59 may be eliminated, and the communication method setting policy acquisition unit 125 and the communication method setting policy storage unit 127 may not be needed.

The communication method resetter 131 in the network management apparatus 100b requests from the network apparatus B the setting information of the port identified by the port identification information (port number 2 in the above-described example) included in the link partner information, in accordance with the identification information of the network apparatus B within the link partner information included in the setting incompatibility notification (step S61). This request is performed using CLI or the like. The communication method setter 309 in the network apparatus B receives the port setting information request from the network management apparatus 100 (step S63). The communication method setter 309 reads the port setting information (also including current setting information in the case of auto-negotiation) from the communication method setting storage unit 311, and then sends the port setting information to the network management apparatus 100 (step S65). An authentication is performed in a modification of the setting but is not performed in the reading of the setting information. Alternatively, an authentication operation may also be performed in the reading of the setting information. Upon receiving the port setting information from the network apparatus B, the communication method resetter 131 in the network management apparatus 100b stores the port setting information on a storage device such as, e.g., a main memory or a work memory (step S67). Processing proceeds to a routine of FIG. 7B via an entry point A. In other words, subsequent routine remains unchanged from that of the first embodiment.

The above-described processes allow a network management apparatus having a simple structure to work. As with the first embodiment, the communication efficiency is improved by modifying the setting of the link partner.

Third Embodiment

Figure 12:
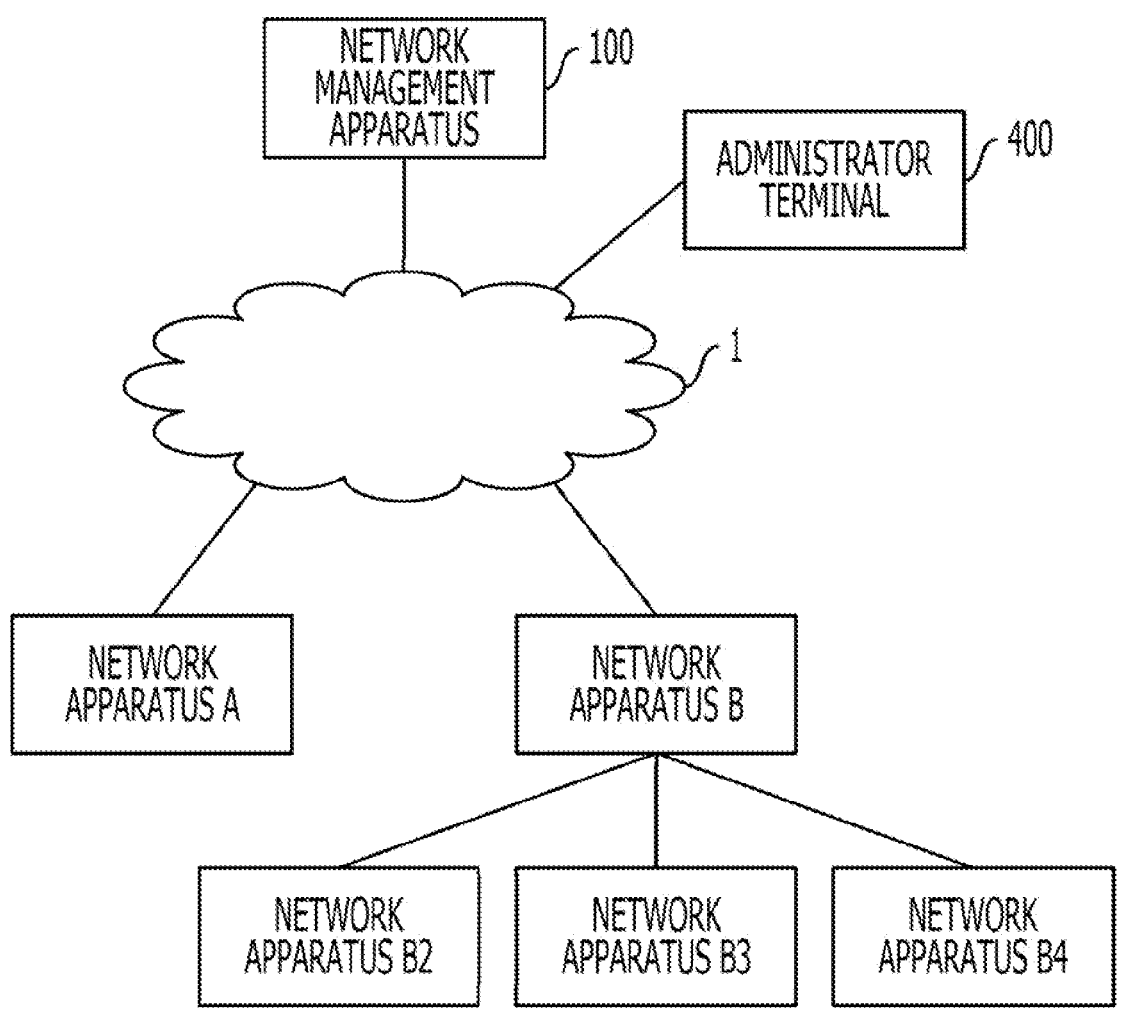
FIG. 12 illustrates a network configuration of a third embodiment.

FIG. 12 illustrates a network configuration of a network of a third embodiment. As in the first embodiment, a variety of network apparatuses are connected to the network 1 in the third embodiment. The network management apparatus 100 performs a main process of the embodiment. The network apparatus A has a new function introduced in the embodiment. The network apparatus B has the related-art function. A particular port of the network apparatus A is connected to a particular port of the network apparatus B. In accordance with the embodiment, the network apparatuses A and B are layer 2 switches or routers, and are connected with each other and perform communications in accordance with the IEEE 802.3 standard.

As illustrated in FIG. 12, other ports of the network apparatus B are connected to network apparatuses B2-B4. The ports of the network apparatus B are set for communication methods, and the data illustrated in FIG. 6 are stored on the communication method setting storage unit 311.

Also connected to the network 1 are a server (not illustrated) and an administrator terminal 400. The administrator terminal 400 is a personal computer operated by the network administrator, and executes a mail client program.

The network management apparatus 100 and the network apparatuses A and B are identical in structure to those in the first embodiment, but are partly different from those in the first embodiment as indicated in the process described below.

Figure 13A:
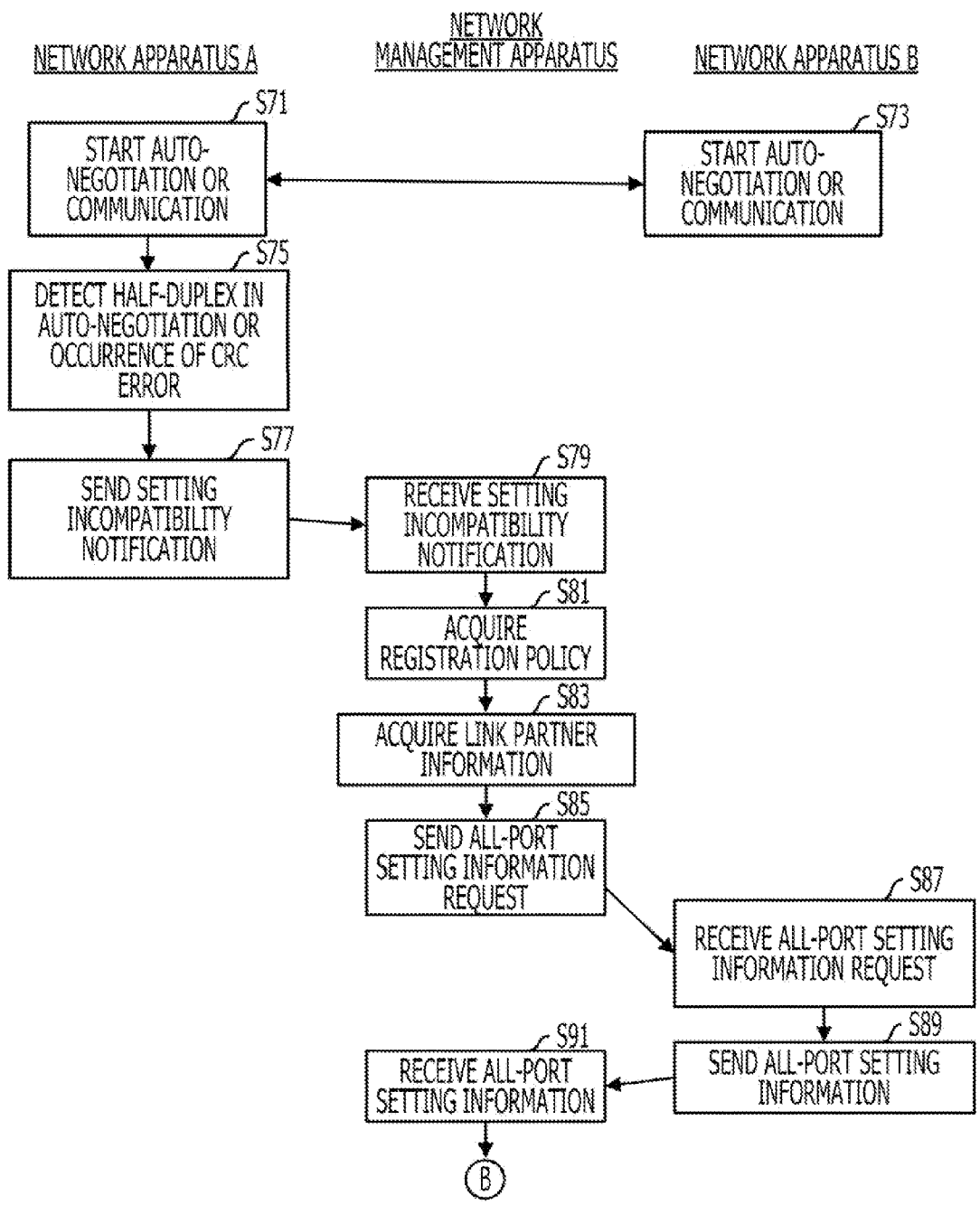
FIGS. 13A and 13B are flowcharts illustrating a process of the third embodiment.

The process of the embodiment is described with reference to FIGS. 13A and 13B. The network apparatuses A and B are linked up with the port having port number 1 on the network apparatus A connected to the port having port number 2 on the network apparatus B via a cable.

If the ports of the network apparatuses A and B are set for auto-negotiation, the auto-negotiation processor 206 and the auto-negotiation processor 307 perform respectively auto-negotiation. If fixed full-duplex or fixed half-duplex is port-set on the network apparatuses A and B, communications start (steps S71 and S73). Steps S71 and S73 are respectively identical to steps S1 and S3 in the first embodiment.

In accordance with the embodiment, as well, the auto-negotiation processor 206 may set half-duplex in response to auto-negotiation results and notify the communication method verification unit 210 of the auto-negotiation results or the CRC error detector 207 may detect a CRC error caused by a late collision and notify the communication method verification unit 210 of the detection of the CRC error. In such a case, the communication method verification unit 210 detects the half-duplex setting in the auto-negotiation or the occurrence of the CRC error (step S75).

The communication method verification unit 210 then instructs the manager notification unit 208 to send the setting incompatibility notification. The manager notification unit 208 reads an IP address or a MAC address of the network management apparatus 100 stored on the manager information storage unit 209, and sends to the IP address or the MAC address the setting incompatibility notification including identification information of the network apparatus A (such as, e.g., an IP address, a MAC address, or a network name) and port identification information of a linked up communication port 201 (such as, e.g., a port number) (step S77).

The notification receiver 117 in the network management apparatus 100 receives the setting incompatibility notification including the identification information of the network apparatus A and the port identification information of linked up communication port 201, and outputs the setting incompatibility notification to the communication method resetter 119 (step S79). The communication method resetter 119 requests the policy from the communication method setting policy acquisition unit 125. In response to the request, the communication method setting policy acquisition unit 125 reads the set policy from the communication method setting policy storage unit 127, and outputs the read policy to the communication method resetter 119. The communication method resetter 119 receives the policy from the communication method setting policy acquisition unit 125 (step S81). The setting incompatibility notification may include setting information of the port 1 of the network apparatus A. If the setting incompatibility notification includes the setting information of the port 1 of the network apparatus A, the step S81 may be eliminated, and the communication method setting policy acquisition unit 125 and the communication method setting policy storage unit 127 may not be needed.

The communication method resetter 119 in the network management apparatus 100 requests from the link partner information acquisition unit 121 the setting incompatibility notification including the identification information of the network apparatus A and link partner information corresponding to a port identifier of linked up communication port 201. In response to the request, the link partner information acquisition unit 121 reads from the link partner information storage unit 123 the link partner information and outputs the link partner information to the communication method resetter 119. The link partner information includes the identification information of the network apparatus B (e.g., an IP address, a MAC address, and other identification information such as a network name) and identification information of a port connected to the number 1 port of the network apparatus A and linked up (port number 2 here). The communication method resetter 119 receives the link partner information from the link partner information acquisition unit 121 (step S83).

Using the identification information of the network apparatus B included in the link partner information acquired in step S83, the communication method resetter 119 requests the network apparatus B to send setting information of all ports (step S85). This request may be performed using CLI or the like. The communication method setter 309 in the network apparatus B receives the port setting information request from the network management apparatus 100 (step S87). The communication method setter 309 reads the port setting information (also including current setting information in the case of auto-negotiation) from the communication method setting storage unit 311, and then sends the port setting information to the network management apparatus 100 (step S89). In the discussion of the present invention, an authentication operation is performed in a modification of the setting but is not performed in the reading of the setting information. Alternatively, an authentication operation may also be performed in the reading of the setting information. Upon receiving the port setting information of all ports from the network apparatus B, the communication method resetter 119 in the network management apparatus 100 stores the port setting information on a storage device such as a main memory or a work memory (step S91). Processing proceeds to a routine of FIG. 13B via an entry point B.

Figure 13B:
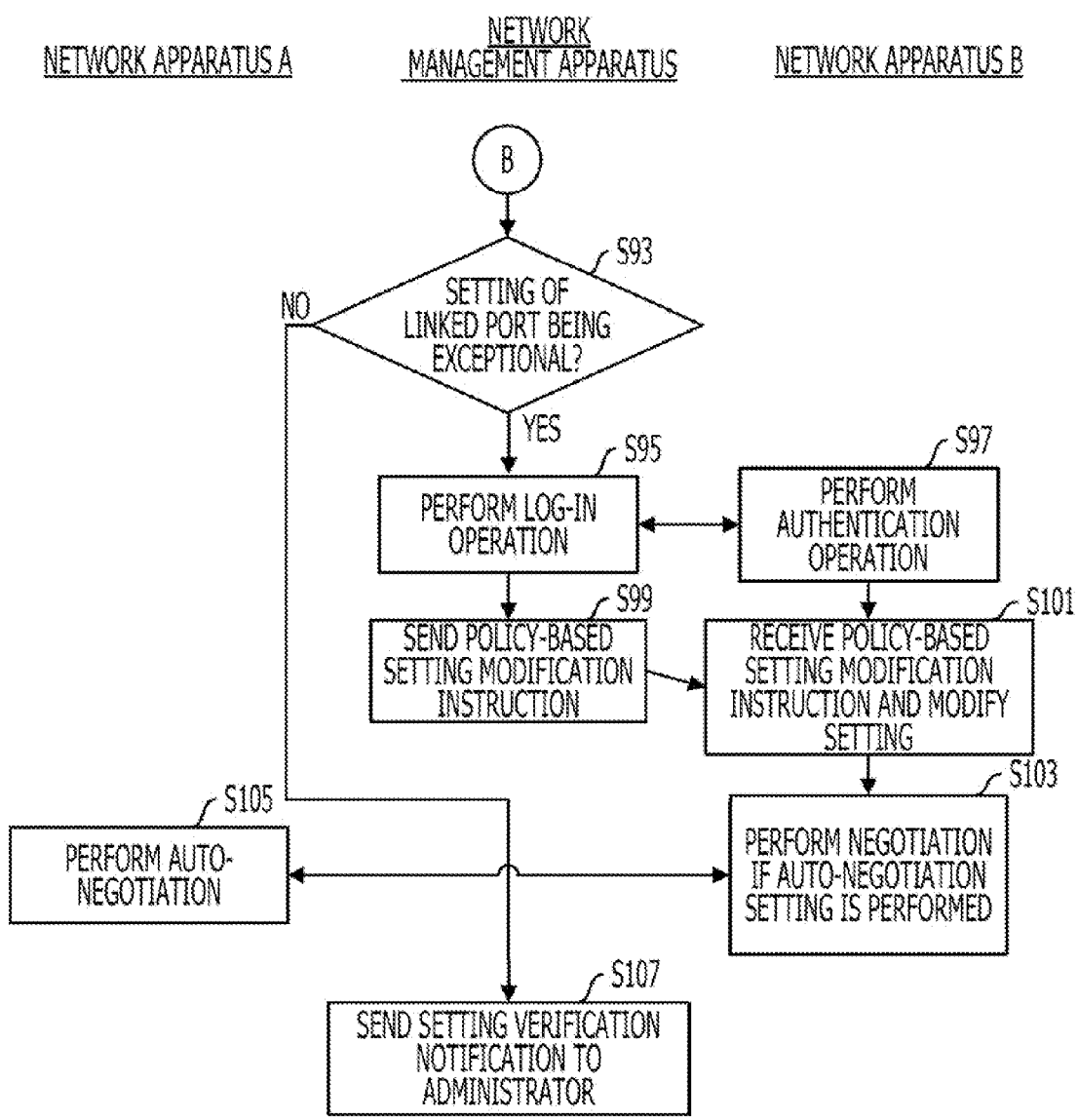

Referring to FIG. 13B, the communication method resetter 119 refers to the registered policy acquired in step S81 (the communication method set for the port having port number 1 on the network apparatus A) and the port setting information of all ports acquired in step S91 in order to judge whether the communication method set for a port of the network apparatus B connected to and linked up with the network apparatus A is exceptional (step S93). Herein, a communication method referred to herein as exceptional in the present embodiment, refers to a communication method in which the automatic setting modification results in no substantial effect.

For example, the policy may indicate auto-negotiation, and the communication methods set for ports connected to the network apparatuses B1-B4 may be auto-negotiation, and the communication method set for the port having port number 2 on the network apparatus B may be fixed full-duplex or fixed half-duplex. The communication method resetter 119 then judges that the communication method is exceptional. Also, the policy may indicate fixed full-duplex, and the communication methods set for ports connected to the network apparatuses B1-B4 may be fixed full-duplex, and the communication method set for the port having port number 2 on the network apparatus B may be auto-negotiation or fixed half-duplex. In this case, as well, the communication method resetter 119 judges that the communication method is exceptional.

The ports on the network apparatus B may have different communication methods from each other. Alternatively, all ports on the network apparatus B may be set to auto-negotiation with the policy indicating fixed full-duplex, or all ports on the network apparatus B may be set to fixed full-duplex with the policy indicating auto-negotiation. The communication method of the port having port number 2 on the network apparatus B is not exceptional.

If the communication method is exceptional in the present embodiment, automatic setting modification results in no substantial effect. If it is judged that the communication method is exceptional, the communication method resetter 119 in the network management apparatus 100 performs a log-in operation on the network apparatus B (step S95). The communication method setter 309 in the network apparatus B performs an authentication operation on the network management apparatus 100 (step S97). If the authentication operation is unsuccessful, no further operation is performed. It is assumed here that the authentication operation has been successfully completed. The log-in operation and the authentication operation are known operations and no further discussion thereabout are provided here.

In response to the policy, the communication method resetter 119 instructs the network apparatus B to modify the setting of the port having port number 2 on the network apparatus B (step S99). The communication method setter 309 in the network apparatus B receives a policy-based setting modification instruction from the network management apparatus 100. In response to the policy-based setting modification instruction, the communication method setter 309 sets the communication method of the port having port number 2 to auto-negotiation or fixed full-duplex (step S101).

If the policy is fixed full-duplex and fixed full-duplex is set on the network apparatus B as a link partner, a calibration may be performed on the port having port number 2 on the network apparatus B. Communications then start. If auto-negotiation is set on the network apparatus B, the apparatuses are treated as being linked up at the moment of the modification of the setting. An auto-negotiation is performed between the auto-negotiation processor 206 in the network apparatus A and the auto-negotiation processor 307 in the network apparatus B. Full-duplex is thus set (steps S103 and S105).

The network apparatus A modifies the setting of the network apparatus B as a link partner of the network apparatus A in accordance with the policy. The network apparatus A thus performs efficient communication. The setting is modified on the network apparatus B only if the communication method of the port connected to the network apparatus A is exceptional. The effect of the setting modification is thus minimized.

If it is determined in step S93 that the communication method is not exceptional, an automatic setting modification is judged to be inappropriate. The communication method resetter 119 in the network management apparatus 100 sends a setting verification notification to a mail address of the administrator pre-registered on a storage device such as a memory (step S107). The setting verification information includes the identification information of the network apparatus B and the port setting information of all ports. In this way, the administrator can review the setting of the network apparatus B.

If the above-described process has detected a phenomenon that indicates a subsequent inefficient communication, the administrator has the option to learn whether to modify automatically the communication method setting of a particular port on the network apparatus B.

Fourth Embodiment

A network configuration of a fourth embodiment is identical to that of the third embodiment illustrated in FIG. 3. The network management apparatus 100 (the network management apparatus 100b in the second embodiment) and the network apparatuses A and B are substantially identical in structure to the counterparts in the second embodiment but the steps or process performed by the network apparatuses A and B are partially different from those in the second embodiment.

Figure 14:
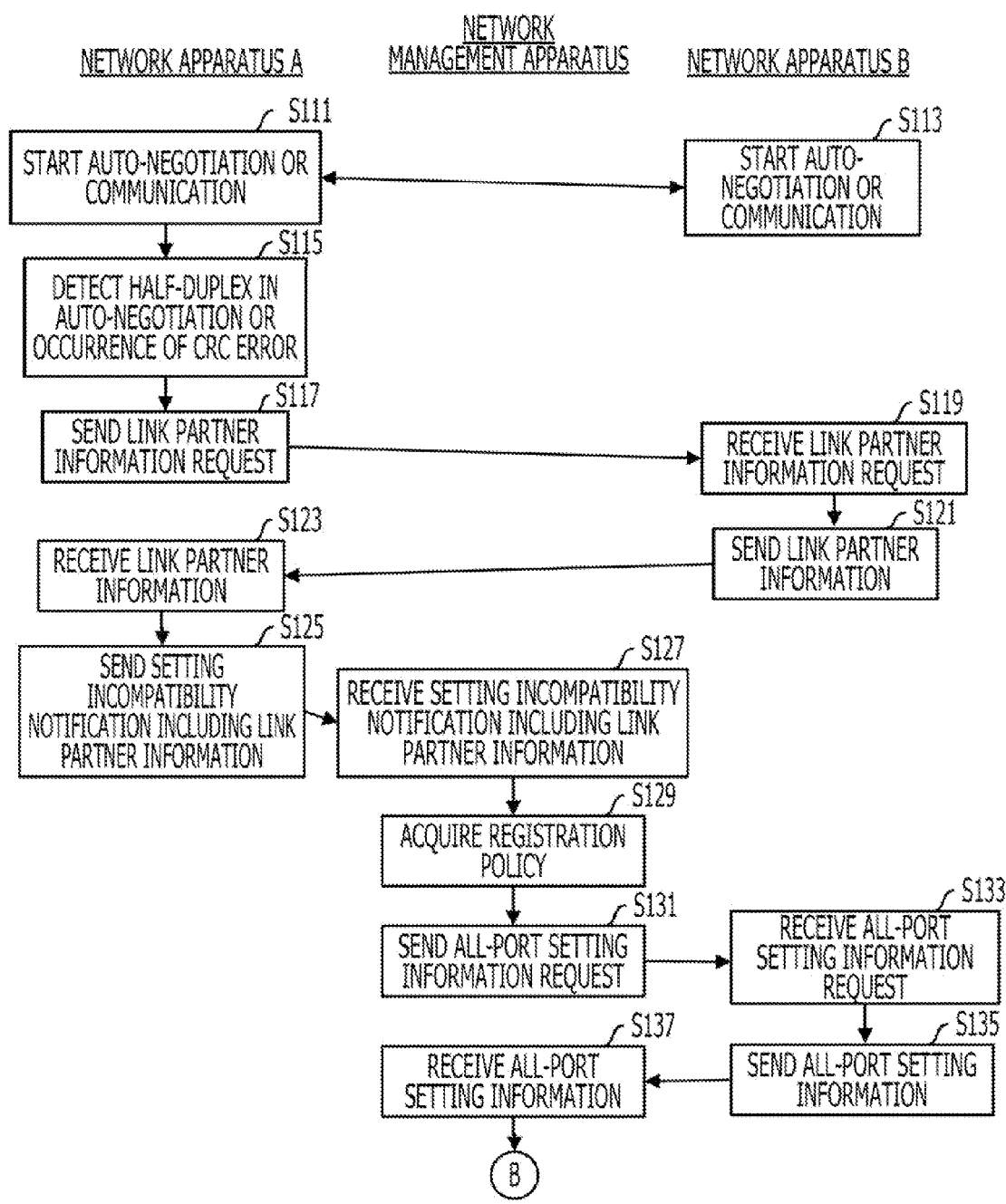
FIG. 14 is a flowchart illustrating a process of a fourth embodiment.

The process of the embodiment is described with reference to FIG. 14. The network apparatuses A and B are linked up with a port having port number 1 on the network apparatus A connected to a port having port number 2 on the network apparatus B via a cable.

If the ports of the network apparatuses A and B are set for auto-negotiation, the auto-negotiation processor 206 and the auto-negotiation processor 307 perform, respectively, auto-negotiation. If fixed full-duplex or fixed half-duplex is port-set on the network apparatuses A and B, communications start (steps S111 and S113). Steps S111 and S113 are respectively identical to steps S41 and S43 in the second embodiment.

In accordance with the embodiment, the auto-negotiation processor 206 may set half-duplex in response to auto-negotiation results and notify the communication method verification unit 225 of the auto-negotiation results or the CRC error detector 207 may detect a CRC error caused by a late collision and notify the communication method verification unit 225 of the detection of the CRC error. In such a case, the communication method verification unit 225 detects the half-duplex setting in the auto-negotiation or the CRC error (step S115).

The communication method verification unit 225 requests the link partner information acquisition unit 221 to acquire adjacent node information regarding the communication port 201 through which the half-duplex setting or the occurrence of the CRC error is detected. The link partner information acquisition unit 221 requests the network apparatus B to send the link partner information regarding the communication port 201 through which the half-duplex setting or the occurrence of the CRC error is detected (step S117). The link partner information includes the identification information of the network apparatus B and the identification information of the port number of the port connected to the network apparatus A. As previously discussed, this request is performed through LLDP or the like. Upon receiving the link partner information request (step S119), the link partner information reply unit 321 in the network apparatus B sends the link partner information to the network apparatus A as a requesting source (step S121). The link partner information includes the identification information of the network apparatus B (such as, e.g., the IP address, the MAC address, or the other identifier such as the network name) and the port identification information of the port number of the linked up port (step S121).

The link partner information acquisition unit 221 in the network apparatus A receives from the network apparatus B the link partner information and outputs the received link partner information to the communication method verification unit 225 (step S123).

The communication method verification unit 225 outputs the link partner information to the manager notification unit 223 and instructs the manager notification unit 223 to send the setting incompatibility notification. The manager notification unit 223 reads an IP address or a MAC address of the network management apparatus 100 stored on the manager information storage unit 209, and sends to the IP address or the MAC address the setting incompatibility notification including the link partner information (step S125). The setting incompatibility notification may further include the identification information of the network apparatus A (such as, e.g., the IP address, the MAC address, or the network name) and the port identification information of the communication port 201 linked up (such as, e.g., the port number).

The notification receiver 117 in the network management apparatus 100b receives the setting incompatibility notification including the link partner information, and outputs the received setting incompatibility notification to the communication method resetter 131 (step S127). The communication method resetter 131 requests the policy from the communication method setting policy acquisition unit 125. In response to the request, the communication method setting policy acquisition unit 125 reads the set policy from the communication method setting policy storage unit 127, and outputs the read policy to the communication method resetter 131. The communication method resetter 131 receives the policy from the communication method setting policy acquisition unit 125 (step S129). The setting incompatibility notification may include setting information of the port 1 of the network apparatus A. If the setting incompatibility notification includes the setting information of the port 1 of the network apparatus A, the step S129 may be eliminated, and the communication method setting policy acquisition unit 125 and the communication method setting policy storage unit 127 may not be needed.

The communication method resetter 131 in the network management apparatus 100b requests from the network apparatus B the setting information of all ports, in accordance with the identification information of the network apparatus B within the link partner information included in the setting incompatibility notification (step S131). This request is performed using CLI or the like. The communication method setter 309 in the network apparatus B receives the all-port setting information request from the network management apparatus 100 (step S133). The communication method setter 309 reads the all-port setting information (also including current setting information in the case of auto-negotiation) from the communication method setting storage unit 311, and then sends the all-port setting information to the network management apparatus 100 (step S135). An authentication operation is performed in a modification of the setting but is not performed in the reading of the setting information. Alternatively, an authentication operation may also be performed in the reading of the setting information. Upon receiving the all-port setting information from the network apparatus B, the communication method resetter 131 in the network management apparatus 100b stores the port setting information on a storage device such as a main memory or a work memory (step S137).

Processing proceeds to the routine of FIG. 13B via an entry point B. More specifically, subsequent process is identical to the process of the third embodiment.

A network management apparatus having a simple structure works in the above-described process. As with the third embodiment, the communication efficiency is improved by modifying automatically the setting of the link partner if the communication method is exceptional. If the communication method is not exceptional, the administrator has an option to learn whether to modify the setting.

The embodiments have been discussed. The technique is not limited to the above-described embodiments. For example, the order of process steps may be modified, or the process steps may be concurrently performed in parallel. The network apparatuses A and B and the network management apparatus 100 may be implemented using hardware only, or a combination of hardware and software.

Figure 15:
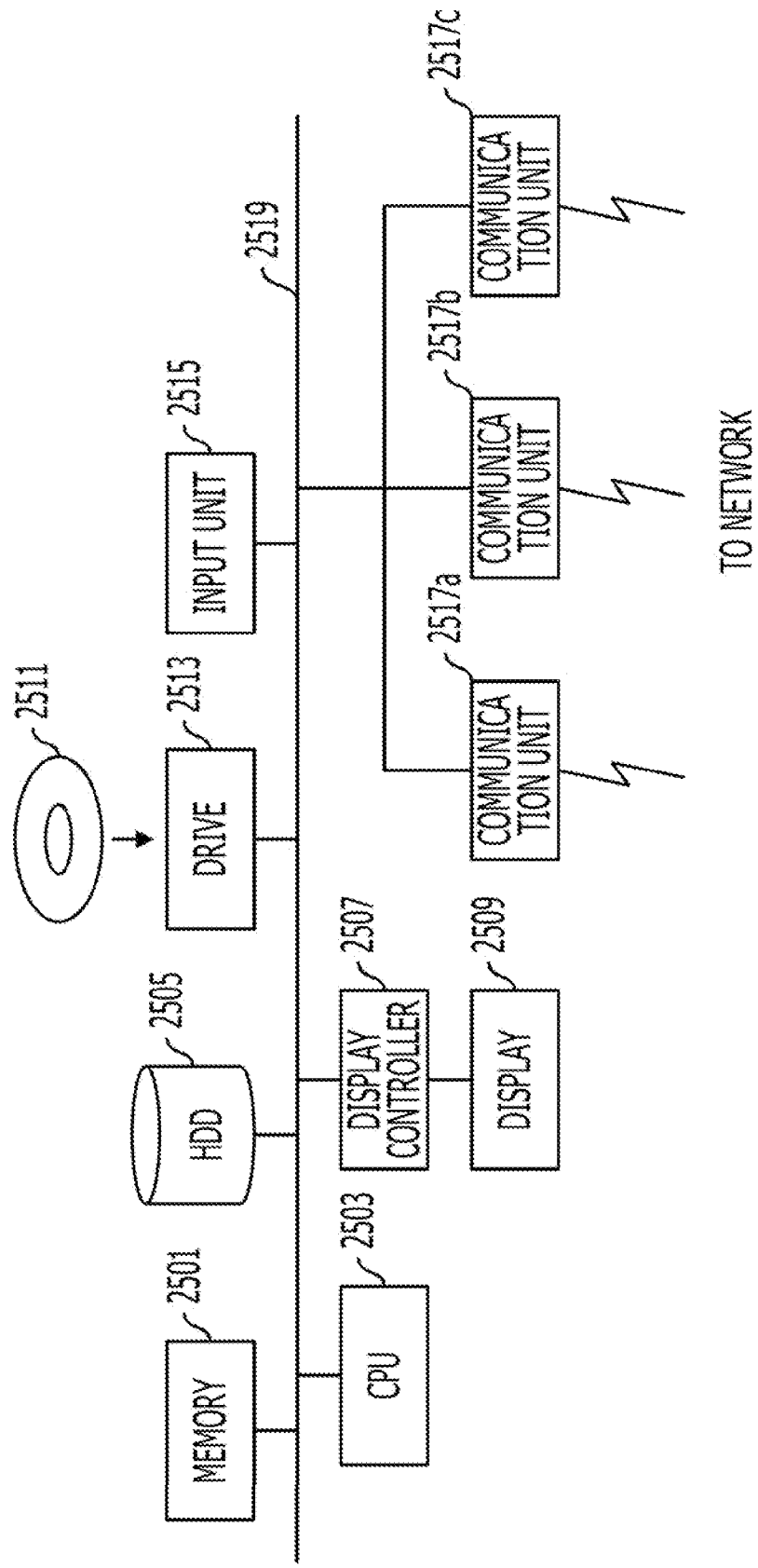
FIG. 15 illustrates a structure of a network apparatus and a network management apparatus.

The network apparatuses A and B and the network management apparatuses 100 and 100b, described above, may be implemented using a computer apparatus such as a personal computer. As illustrated in FIG. 15, the computer apparatus includes memory 2501, a CPU 2503, a hard disk drive (HDD) 2505, a display controller 2507 connected to a display 2509, a drive 2513 connected to a removable disk 2511, an input unit 2515, communication units 2517 (communication units 2517a-2517c as illustrated) connected to networks, and a bus 2519 interconnecting these elements. The display controller 2507, the display 2509, the drive 2513, and the input unit 2515 may not be included in the computer apparatus. An operating system (OS), and an application program for performing the process of the embodiments are stored on the HDD 2505. When the process is executed by the CPU 2503, the programs are read onto the memory 2501 from the HDD 2505. The CPU 2503 controls the display controller 2507, the communication unit 2517, and the drive 2513 to perform respective processes thereof. Data input via one communication unit 2517 is output via another communication unit 2517. The CPU 2503 controls the communication unit 2517 to switch output destinations appropriately. Process interim data is stored on the memory 2501, and if necessary, is stored on the HDD 2505. In accordance with the embodiments of the technique, the application program for executing the above-described process is stored on the computer-readable removable disk 2511 and the program-recorded removable disk 2511 is then distributed. The program is then installed onto the HDD 2505 from the removable disk 2511 loaded on the drive 2513. The program may be installed onto the HDD 2505 via a network such as the Internet and the communication unit 2517.

The computer apparatus performs functions of the network apparatus or the network management apparatus when hardware including the CPU 2503, the memory 2501, and the like cooperate systematically with the OS and the application program.

For example, the hardware such as the CPU 2503, the memory 2501, and the like cooperate systematically with the OS and the application program to implement the functions of the network management apparatuses 100 and 100b and the network apparatuses A and B are performed. Data for the network apparatuses A and B and the network management apparatuses 100 and 100b is stored on one the memory 2501 and the HDD 2505, for example.

The technique is summarized below.

Figure 16:
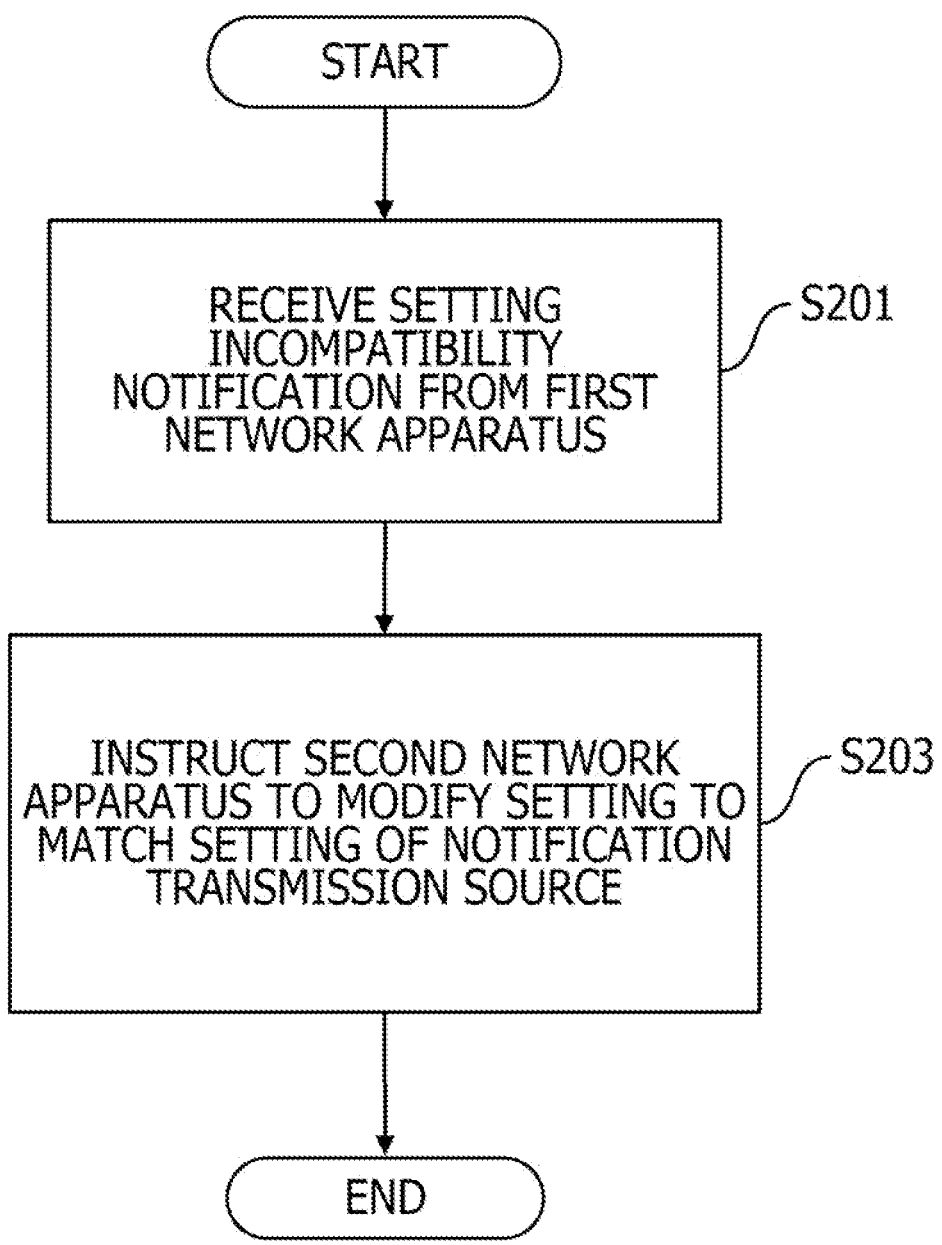
FIG. 16 is a flowchart of a first setting method of a technique discussed here.

A first setting method of the technique is performed by the network management apparatus. The first setting method includes receiving from a first network apparatus a notification of a communication method setting incompatibility with a second network apparatus connected to a first port of the first network apparatus (step S201 in FIG. 16) and instructing the second network apparatus to modify on the second network apparatus a communication method of the second port of the second network apparatus connected to the first network apparatus such that the communication method of the second port matches a communication method of the first port of the first network apparatus (step S203 in FIG. 16).

The communication method set for the second port of the second network apparatus as the link partner of the first network apparatus is modified to match the communication method correctly set for the first port of the first network apparatus. Efficient communication is thus possible. The network management apparatus and the first network apparatus arranged in a network causes an appropriate communication method to be automatically set in the second network apparatus having no particular function.

The first setting method of the technique may further include a step of requesting the second network apparatus connected to the first port of the first network apparatus to send information regarding the communication method of the second network apparatus, a step of receiving from the second network apparatus the information regarding the communication method of the second network apparatus, and a step of judging whether the received information regarding the communication method set for the second port is incompatible with the communication method set for the first port of the first network apparatus. If an incompatibility is detected in the step of judging, the setting modification step described above may be performed. The setting modification is thus performed by detecting the setting incompatibility.

Information identifying the second network apparatus connected to the first port of the first network apparatus is identified based on identification information of the first network apparatus and identification information of the first port, included in the communication method setting incompatibility notification on a storage unit (the link partner information storage unit in the embodiments) storing information of apparatuses connected to the port of each network apparatus in the network. The setting incompatibility notification may include information of the second network apparatus so that the information of the second network apparatus is identified from the setting incompatibility notification. With the above-described storage unit, the information of the second network apparatus is identified at a high speed. If the setting incompatibility notification includes the information of the second network apparatus, such a storage unit is not needed.

The step of judging may include identifying the communication method set for the first port of the first network apparatus from the policy stored on the communication method setting policy storage unit. The communication method setting policy storage unit stores as the policy the communication method set for the first port of the first network apparatus. The communication method set for the first port of the first network apparatus may be included in the setting incompatibility notification.

Figure 17:
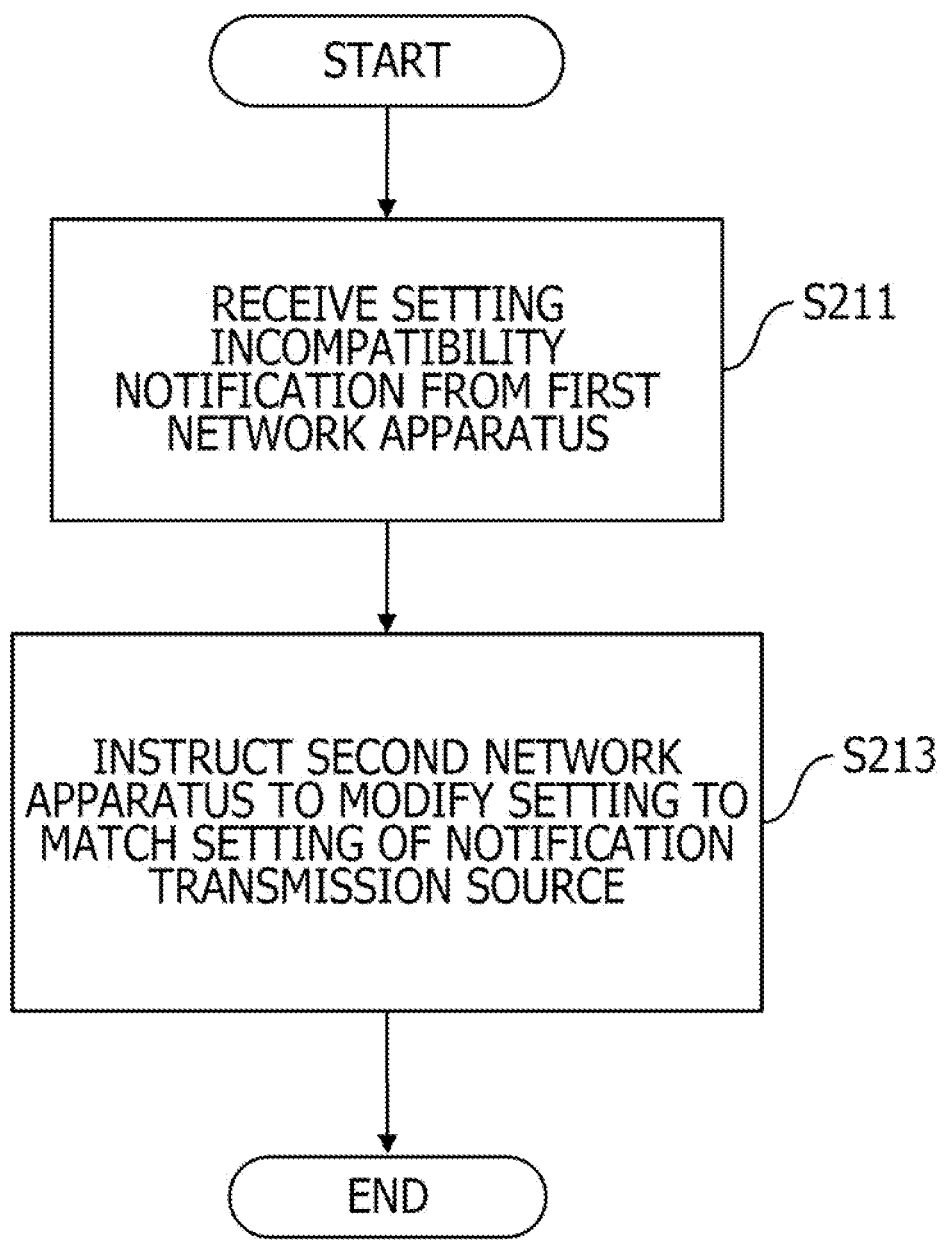
FIG. 17 is a flowchart of a second setting method of the technique.

A second setting method of the technique includes detecting an occurrence of incompatibility of the communication method set for a first port of a network apparatus with a second port of another network apparatus (step S211 in FIG. 17), and sending to a network management apparatus the setting incompatibility notification including information identifying the second port of the other network apparatus or information identifying own network apparatus and the first port of own network apparatus (step S213 in FIG. 17).

With these network apparatuses, the communication method of the other network apparatus as a link partner is appropriately modified. Efficient communications are thus performed.

In accordance with the second setting method of the technique, information identifying the second port of the other network apparatus may be acquired from the other network apparatus. This arrangement frees the network management apparatus from storing beforehand data of the network.

A third setting method of the technique is performed by the network management apparatus.

Figure 18:
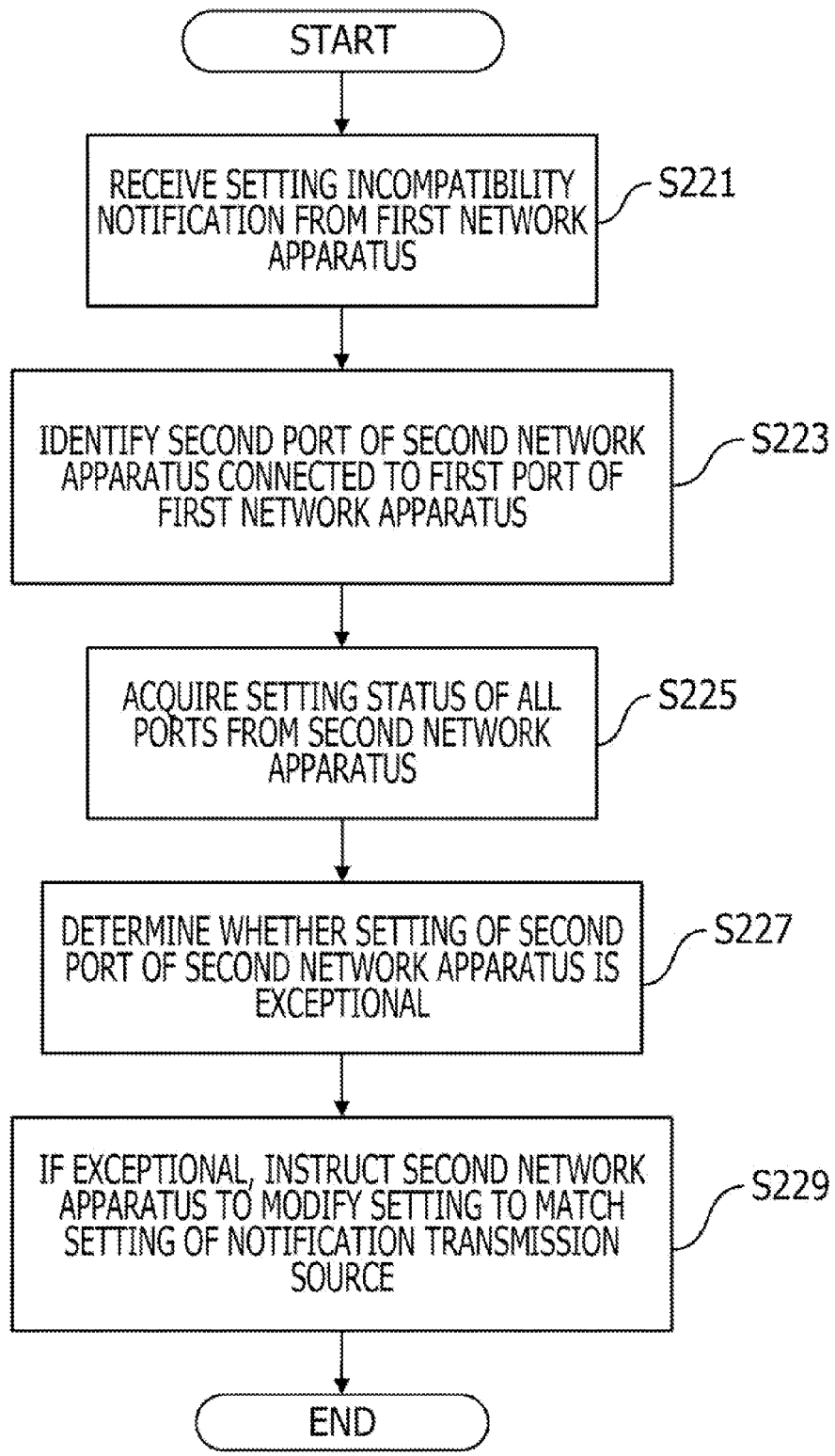
FIG. 18 is a flowchart of a third setting method of the technique.

The third setting method includes receiving from the first network apparatus a setting incompatibility notification regarding an incompatibility of the first network apparatus with the second network apparatus connected to the first port (step S221 in FIG. 18), identifying the second port of the second network apparatus connected to the first port of the first network apparatus (step S223 in FIG. 18), acquiring from the second network apparatus the communication methods of all ports on the second network apparatus (step S225 in FIG. 18), judging whether a condition that the communication method of the second port of the second network apparatus is exceptional among the communication method of the first port of the first network apparatus and the communication methods of all ports of the second network apparatus is satisfied (step S227 in FIG. 18), and if the condition is satisfied, causing the second network apparatus to modify the communication method of the second port of the second network apparatus to be the communication method of the first port of the first network apparatus (step S229 in FIG. 20).

Whether to set auto-negotiation or fixed full-duplex typically depends on the policy of the administrator. Since the exceptional condition described above is understood as being caused by a mere setting error, automatic setting modification is appropriate.

A step of sending to the administrator the setting incompatibility notification including the information identifying the second network apparatus may be included if it is judged that the above-described condition is not satisfied in the third setting method. The condition is not satisfied typically because different settings are mixed or the setting policy is different from apparatus to apparatus. The administrator is thus given an option to learn whether to modify the setting.

In a particular one of the above-described steps, the information identifying the second network apparatus connected to the first port of the first network apparatus may be identified based on the identification information of the first network apparatus and the identification information of the first port, included in the communication method setting incompatibility notification on the storage unit storing the information of apparatuses connected to the port of each network apparatus in the network. Alternatively, the information of the second network apparatus is identified from the setting incompatibility notification if the setting incompatibility notification includes information of the second network apparatus.

A program for causing the network apparatus and the network management apparatus to perform the above-described processes is created. The program may be stored on a computer-readable storage medium or a computer-readable storage device, such as a flexible disk, a compact-disk ROM (CD-ROM), a magneto-optical disk, a semiconductor memory, or a hard disk. Process interim data may be temporarily stored on a storage device such as a memory on the computer.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions has been described in detail, it should be understood that the various changes, substitutions, and alterations could be made hereto without departing from the spirit and scope of the invention.

The invention claimed is:

1. A network management apparatus comprising:
a memory; and
a processor coupled to the memory and configured to
receive, from a first network apparatus, a notification of a communication method setting incompatibility with a second network apparatus connected to a first port of the first network apparatus, and
instruct the second network apparatus to set a communication method of a second port of the second network apparatus connected to the first network apparatus such that the communication method of the second port matches a communication method of the first port of the first network apparatus.

2. The network management apparatus according to claim 1, wherein the processor is further configured to:
request the second network apparatus to send information regarding the communication method of the second port,
receive, from the second network apparatus, the information regarding the communication method of the second port,
determine whether the received information regarding the communication method of the second port is incompatible with the communication method of the first port of the first network apparatus, and
instruct the second network apparatus to modify the communication method of the second port based on a determination that the received information is incompatible with the communication method of the first port.

3. The network management apparatus according to claim 1, wherein the notification includes identification information of the first network apparatus and identification information of the first port, and
the second network apparatus connected to the first port of the first network apparatus is identified by referencing information of network apparatuses connected to the ports of each network apparatus in the memory.

4. The network management apparatus according to claim 1, wherein the notification includes information of the second network apparatus, and
the second network apparatus is identified based on the information of the second network apparatus included in the notification.

5. The network management apparatus according to claim 1, wherein the processor is configured to:
determine the communication method of the second port of the second network apparatus is exceptional, and
instruct the second network apparatus to set the communication method based on the determination.

6. The network management apparatus according to claim 5, wherein the processor is further configured to:
determine the communication method of the second port of the second network apparatus is not exceptional, and
send a setting verification notification including information identifying the second network apparatus to an administrator.

7. A network apparatus comprising:
a memory;
a processor coupled to the memory and configured to
detect an incompatibility between a communication method of a first port connected to a destination network apparatus and a communication method of a second port of the destination network apparatus connected to the first port, and
send, to a network management apparatus, a setting incompatibility notification including information identifying at least one of the second port and the first port.

8. The network apparatus according to claim 7,
wherein the processor is further configured to acquire, from the destination network apparatus, information identifying the second port of the destination apparatus.

9. The network apparatus according to claim 7, wherein the processor is configured to detect the incompatibility based on detecting a setting of half-duplex resulting from an auto-negotiation or detecting a cyclic redundancy check error.

10. A non-transitory computer readable medium storing a program, the program making a computer execute a method comprising:
receiving, from a first network apparatus, a notification of a communication method setting incompatibility with a second network apparatus connected to a first port of the first network apparatus; and
instructing the second network apparatus to set a communication method of the second port of the second network apparatus connected to the first network apparatus to match a communication method of the first port of the first network apparatus.

11. A network management method for managing a plurality of network apparatuses, the method comprising:
   receiving, from a first network apparatus, a notification of a communication method setting incompatibility with a second network apparatus connected to a first port of the first network apparatus; and
   instructing a the second network apparatus to set a communication method of a second port of the second network apparatus connected to the first network apparatus such that the communication method of the second port matches a communication method of the first port of the first network apparatus.

12. A method for reconfiguring a network management apparatus including a processor and memory for managing a plurality of network apparatuses, the method comprising:
   storing executable instructions in the memory;
   causing the processor to execute the instructions, the instructions causing the computer to operate as
   a receiving unit to receive, from a first network apparatus, a notification of a communication method setting incompatibility with a second network apparatus connected to a first port of the first network apparatus; and
   a setting unit to instruct a the second network apparatus to set a communication method of a second port of the second network apparatus connected to the first network apparatus such that the communication method of the second port matches a communication method of the first port of the first network apparatus.

13. A method for monitoring communications between a first network apparatus and a second network apparatus, the method comprising:
   monitoring the first network apparatus and the second network apparatus for a half-duplex setting and a cyclic redundancy check error; and
   determining that a communication method incompatibility exists between the first network apparatus and the second network apparatus based on at least one of a half-duplex setting resulting from an auto-negotiation between the first network apparatus and the second network apparatus and detection of a late collision.

* * * * *